US012347686B2

(12) United States Patent
Fan

(10) Patent No.: US 12,347,686 B2
(45) Date of Patent: *Jul. 1, 2025

(54) SEMICONDUCTOR DEVICE STRUCTURE AND METHOD FOR PREPARING THE SAME

(71) Applicant: NANYA TECHNOLOGY CORPORATION, New Taipei (TW)

(72) Inventor: Cheng-Hsiang Fan, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/508,595

(22) Filed: Nov. 14, 2023

(65) Prior Publication Data

US 2024/0087895 A1    Mar. 14, 2024

Related U.S. Application Data

(60) Division of application No. 18/231,912, filed on Aug. 9, 2023, now Pat. No. 12,293,914, which is a
(Continued)

(51) Int. Cl.
*H01L 21/033*    (2006.01)
*H01L 21/308*    (2006.01)
(Continued)

(52) U.S. Cl.
CPC ........ *H01L 21/0337* (2013.01); *H01L 21/308* (2013.01); *H01L 21/31144* (2013.01);
(Continued)

(58) Field of Classification Search
CPC ............... H01L 21/0337; H01L 21/308; H01L 21/31144; H01L 21/76229; H01L 21/764;
(Continued)

(56) References Cited

U.S. PATENT DOCUMENTS 8,124,525 B1 * 2/2012 Koburger, III ........ H01L 23/528
257/E21.583
8,247,291 B2    8/2012 Min et al.
(Continued)

FOREIGN PATENT DOCUMENTS

CN    102456617 A    5/2012

OTHER PUBLICATIONS

Office Action and and the search report mailed on Dec. 7, 2023 related to Chinese Application No. 202110230787.0.

*Primary Examiner* — Dale E Page
*Assistant Examiner* — Quovaunda Jefferson
(74) *Attorney, Agent, or Firm* — Xuan Zhang

(57) ABSTRACT

The present disclosure provides a semiconductor device structure with fine patterns and a method for forming the semiconductor device structure, which can prevent the collapse of the fine patterns. The semiconductor device structure includes a first target structure and a second target structure disposed over a semiconductor substrate. The semiconductor device structure also includes a first spacer element disposed over the first target structure, wherein a topmost point of the first spacer element is between a central line of the first target structure and a central line of the second target structure in a cross-sectional view.

3 Claims, 35 Drawing Sheets

Related U.S. Application Data continuation-in-part of application No. 17/511,042, filed on Oct. 26, 2021, now Pat. No. 11,776,813, which is a division of application No. 16/811,824, filed on Mar. 6, 2020, now Pat. No. 11,315,786.

(51) Int. Cl.
  *H01L 21/311* (2006.01)
  *H01L 21/762* (2006.01)
  *H01L 21/764* (2006.01)
  *H01L 21/768* (2006.01)

(52) U.S. Cl.
  CPC ...... *H01L 21/76229* (2013.01); *H01L 21/764* (2013.01); *H01L 21/76816* (2013.01); *H01L 21/7682* (2013.01); *H01L 21/76885* (2013.01); *H01L 2221/1036* (2013.01)

(58) Field of Classification Search
  CPC ........... H01L 21/76816; H01L 21/7682; H01L 21/6885; H01L 21/0335; H01L 21/76802; H01L 21/76877; H01L 2221/1036; H01L 23/528
  See application file for complete search history.

(56) References Cited

U.S. PATENT DOCUMENTS

| | | | |
|---|---|---|---|
| 11,315,786 B2* | 4/2022 | Fan | H01L 21/0335 |
| 11,469,181 B2* | 10/2022 | Huang | H10B 12/34 |
| 2007/0241380 A1* | 10/2007 | Hasunuma | H01L 29/40 |
| | | | 257/296 |
| 2012/0043602 A1 | 2/2012 | Zeng et al. | |
| 2014/0306351 A1 | 10/2014 | Kim | |
| 2015/0014759 A1 | 1/2015 | Lee et al. | |
| 2015/0221742 A1 | 8/2015 | Yi et al. | |
| 2016/0163816 A1 | 6/2016 | Yu et al. | |
| 2017/0365504 A1 | 12/2017 | Choi et al. | |
| 2023/0386842 A1* | 11/2023 | Fan | H01L 21/7682 |

* cited by examiner

SEMICONDUCTOR DEVICE STRUCTURE AND METHOD FOR PREPARING THE SAME

CROSS-REFERENCE TO RELATED APPLICATION

This application is a divisional application of U.S. Non-Provisional application Ser. No. 18/231,912 filed Aug. 9, 2023, which is a continuation-in-part application of U.S. Non-Provisional application Ser. No. 17/511,042 filed Oct. 26, 2021, which is a divisional application of U.S. Non-Provisional application Ser. No. 16/811,824 filed Mar. 6, 2020. Those are incorporated herein by reference in their entireties.

TECHNICAL FIELD

The present disclosure relates to a semiconductor device structure with fine patterns and a method for forming the same, and more particularly, to a semiconductor device structure with an intermediate semiconductor device having fine patterns at different levels and a method for forming the same.

DISCUSSION OF THE BACKGROUND

As semiconductor device structures become smaller and more highly integrated, a number of technologies for fabricating fine patterns for semiconductor device structures have been developed. Particularly, photolithography processes are typically used to fabricate electronic and optoelectronic devices on a substrate, and photoresist patterns prepared by the photolithography processes are used as masks in etching or ion implantation processes. As required pitch sizes and critical dimensions (CD) continue to shrink, a fineness of the photoresist patterns becomes increasingly important in maximizing degrees of integration. However, photolithographic processes for fabricating semiconductor features present limitations to increases in resolution of exposure apparatus.

Although existing semiconductor device structures with fine patterns and methods for manufacturing the same have thus far been adequate for their intended purposes, they have not been entirely satisfactory in all respects. Therefore, to date, there are still some problems to be overcome in regards to techniques for forming semiconductor device structures with fine patterns using photolithography processes.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a semiconductor device structure is provided. The semiconductor device structure includes a substrate; a first target structure disposed over the substrate, wherein the first target structure comprises a first portion, a second portion, and a third portion connected to the first portion and the second portion, and wherein a height of the first portion and a height of the second portion are greater than a height of the third portion; a second target structure disposed over the substrate, wherein the second target structure comprises a fourth portion, a fifth portion, and a sixth portion connected to the fourth portion and the fifth portion; a first low-level conductive pattern and a second low-level conductive pattern, wherein each of the first and second low-level conductive patterns is positioned between the first target structure and the second target structure; a first high-level conductive pattern and a second high-level conductive pattern, wherein each of the first and second high-level conductive patterns is positioned in the first target structure; a first conductive pillar and a second conductive pillar, wherein each of the first and second conductive pillars is disposed over the substrate, the first conductive pillar overlaps and is electrically connected to the first low-level conductive pattern, and the second conductive pillar overlaps and is electrically connected to the second low-level conductive pattern; a first landing pad, disposed on and overlapping the first conductive pillar and electrically connected to the first conductive pillar, and a second landing pad, disposed on and overlapping the second conductive pillar and electrically connected to the second conductive pillar, wherein sidewalls of the first and second conductive pillars are recessed from sidewalls of the first and second landing pads, wherein the first and second landing pads are made of a conductive material different from a conductive material of the first and second conductive pillars, and wherein a resistivity of the first and second landing pads is less than a resistivity of the first and second conductive pillars; and a dielectric layer, laterally surrounding the first and second conductive pillars and the first and second landing pads, wherein the dielectric layer includes an air gap between the first and second conductive pillars.

In another embodiment of the present disclosure, a semiconductor device structure is provided. The semiconductor device structure includes a substrate; a first target structure disposed over the substrate, wherein the first target structure comprises a first portion, a second portion, and a third portion connected to the first portion and the second portion, and wherein a height of the first portion and a height of the second portion are greater than a height of the third portion; a second target structure disposed over the substrate, wherein the second target structure comprises a fourth portion, a fifth portion, and a sixth portion connected to the fourth portion and the fifth portion; a low-level conductive pattern, positioned between the first target structure and the second target structure, wherein the low-level conductive pattern has a first top end and a first bottom end; a high-level conductive pattern, positioned in the first target structure, wherein the high-level conductive pattern has a second top end and a second bottom end, the first bottom end is lower than the second bottom end, and the first top end and the second top end are substantially at a same level; a conductive pillar, disposed over the substrate, and overlapping and electrically connected to the low-level conductive pattern; a landing pad, disposed on the conductive pillar, and overlapping and electrically connected to the conductive pillar, wherein sidewalls of the conductive pillar are recessed from sidewalls of the landing pad, the landing pad and the conductive pillar are respectively made of different conductive materials, and a resistivity of the landing pad is less than a resistivity of the conductive pillar; and a storage capacitor, disposed over and electrically connected to the landing pad.

In yet another embodiment of the present disclosure, a method for preparing a semiconductor device structure is provided. The method includes forming a hard mask material over a substrate; etching the hard mask material to form hard mask pillars; forming spacers over sidewall surfaces of the hard mask pillars; etching the hard mask pillars and a target material using the spacers as a mask to integrally form a plurality of target structures, a high-level recess in one of the plurality of target structures, and a low-level recess between two of the plurality of target structures; integrally forming a high-level conductive pattern in the high-level recess and a low-level conductive pattern in the low-level recess; globally forming a conductive pillar and a landing pad above the low-level conductive pattern; forming a capacitor plug on the landing pad; and forming a storage capacitor on the capacitor plug.

Embodiments of an intermediate semiconductor device structure and methods for forming the same are provided. The method for forming the semiconductor device structure may include undercutting a photoresist pattern over a semiconductor substrate, and forming an inner spacer element over a sidewall surface of the photoresist pattern. The inner spacer element has a portion extending into a recess (i.e., the undercut region) of the photoresist pattern to form a footing, and a width of the portion of the inner spacer element increases continuously as the portion extends toward the semiconductor substrate. As a result, the inner spacer element may be prevented from collapsing after removal of the photoresist pattern.

The semiconductor device structure (i.e., the memory device described above) according to embodiments of the present disclosure includes memory cells arranged in an array. Each memory cell includes a transistor and a storage capacitor connected to the transistor. A conductive pillar and a landing pad are disposed between one of the storage capacitors and an active region (e.g., a low-level conductive pattern) of the transistor connected to such storage capacitor. The landing pad is disposed on the conductive pillar, and a sidewall of the conductive pillar is recessed from a sidewall of the landing pad. Therefore, a space between the landing pads of adjacent memory cells is smaller than a space between the conductive pillars of adjacent memory cells. As a result, while depositing a dielectric material between stacked structures formed by one of the conductive pillars and one overlying landing pad, the space between adjacent landing pads may be sealed before the space between adjacent conductive pillars is filled. Consequently, air gaps may be formed between the conductive pillars. Due to a low dielectric constant of air sealed in the air gaps, a parasitic capacitance between the conductive pillars can be reduced by the formation of the air gaps, thus effectively reducing an RC delay of the memory device. As a result, an operating speed of the memory device can be improved. In those embodiments where a resistivity of the landing pads is less than a resistivity of the conductive pillars, a parasitic capacitance between the landing pads may be limited, even though the landing pads have a narrower space than the conductive pillars.

Alternatively, a method for preparing a semiconductor device structure may include forming a hard mask pillar over a target material, forming a spacer over a sidewall surface of the hard mask pillar, and etching the target material and the hard mask pillar using the spacer as a mask to form a spacer element over a target structure. The spacer element may be prevented from collapsing due to support from the target structure.

Alternatively, a method for forming a semiconductor device structure may include forming an energy-removable pattern over a target material, forming a spacer over a sidewall surface of the energy-removable pattern, forming a dielectric layer surrounding the energy-removable pattern and the spacer, and etching the energy-removable pattern, the dielectric layer and the target material using the spacer as a mask to form a spacer element over a target structure. The spacer element may be prevented from collapsing due to high etching selectivity in the etching process for forming the spacer element.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
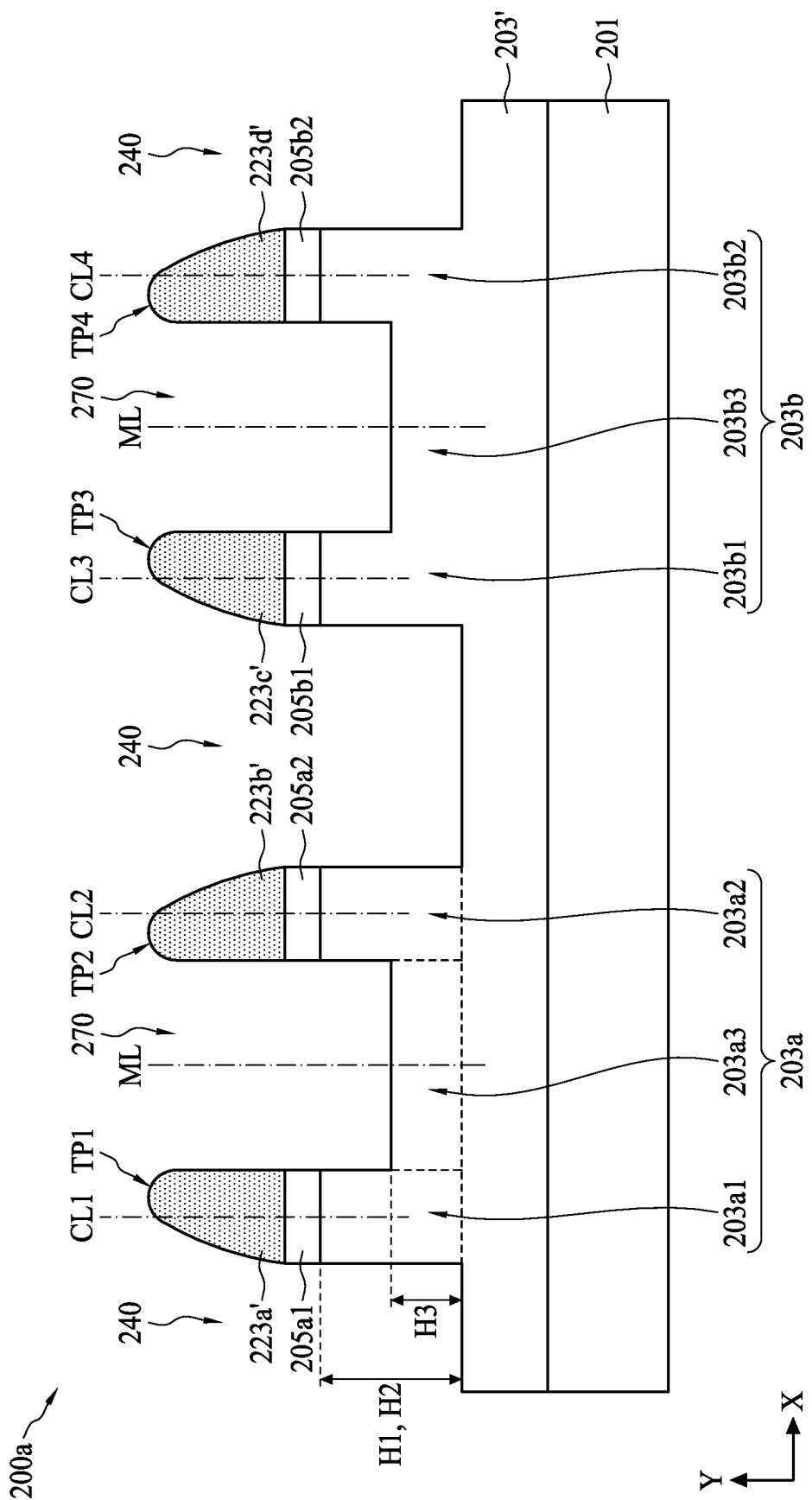
FIG. 1 is a cross-sectional view illustrating an intermediate semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating an intermediate semiconductor device structure 200a, in accordance with some embodiments. As shown in FIG. 1, the intermediate semiconductor device structure 200a includes a target layer 203' disposed over a semiconductor substrate 201, and first and second target structures 203a and 203b disposed over the target layer 203', in accordance with some embodiments.

No obvious interfaces exist between the first target structure 203a and the target layer 203', or between the second target structure 203b and the target layer 203'. Dashed lines shown in FIG. 1 are to clarify the disclosure. It should be noted that the first and second target structures 203a and 203b and the target layer 203' are made of a same material, and are formed simultaneously from a same material layer, in accordance with some embodiments.

More specifically, the first target structure 203a includes a first portion 203a1, a second portion 203a2, and a third portion 203a3 between the first portion 203a1 and the second portion 203a2. Similarly, the second target structure 203b includes a fourth portion 203b1, a fifth portion 203b2, and a sixth portion 203b3 between the fourth portion 203b1 and the fifth portion 203b2.

No obvious interfaces exist between the first portion 203a1 and the third portion 203a3, or between the third portion 203a3 and the second portion 203a2. Similarly, no obvious interfaces exist between the fourth portion 203b1 and the sixth portion 203b3, or between the sixth portion 203b3 and the fifth portion 203b2. The dashed lines shown in FIG. 1 are to clarify the disclosure.

In the first target structure 203a, the first portion 203a1 has a height H1 along a Y-direction, the second portion 203a2 has a height H2 along the Y-direction, and the third portion 203a3 has a height H3 along the Y-direction. In some embodiments, the first height H1 is substantially equal to the height H2, and the height H3 is less than both the heights H1 and H2. Within the context of this disclosure, the word "substantially" means preferably at least 90%, more preferably 95%, even more preferably 98%, and most preferably 99%. In some embodiments, the first portion 203a1, the second portion 203a2 and the third portion 203a3 form a U-shaped structure.

Features of the second target structure 203b may be similar to the abovementioned features of the first target structure 203a, and descriptions thereof are not repeated herein. For example, the fourth portion 203b1, the fifth portion 203b2 and the sixth portion 203b3 form another U-shaped structure, in accordance with some embodiments.

In some embodiments, the intermediate semiconductor device structure 200a also includes a hard mask structure 205a1 disposed over the first portion 203a1 of the first target structure 203a, a hard mask structure 205a2 disposed over the second portion 203a2 of the first target structure 203a, a hard mask structure 205b1 disposed over the fourth portion 203b1 of the second target structure 203b, and a hard mask structure 205b2 disposed over the fifth portion 203b2 of the second target structure 203b. The hard mask structures 205a1, 205a2, 205b1 and 205b2 are made of a same material, and are formed simultaneously from a same material layer, in accordance with some embodiments.

In some embodiments, the intermediate semiconductor device structure 200a further includes a spacer element 223a' disposed over the hard mask structure 205a1, a spacer element 223b' disposed over the hard mask structure 205a2, a spacer element 223c' disposed over the hard mask structure 205b1, and a spacer element 223d' disposed over the hard mask structure 205b2. The spacer elements 223a', 223b', 223c' and 223d' are made of a same material, and are formed simultaneously from a same material layer, in accordance with some embodiments.

As shown in the cross-sectional view of FIG. 1, the first portion 203a1 of the first target structure 203a has a central line CL1, the second portion 203a2 of the first target structure 203a has a central line CL2, the fourth portion 203b1 of the second target structure 203b has a central line CL3, and the fifth portion 203b2 of the second target structure 203b has a central line CL4. Moreover, the spacer element 223a' has a topmost point TP1, the spacer element 223b' has a topmost point TP2, the spacer element 223c' has a topmost point TP3, and the spacer element 223d' has a topmost point TP4.

Figure 2:
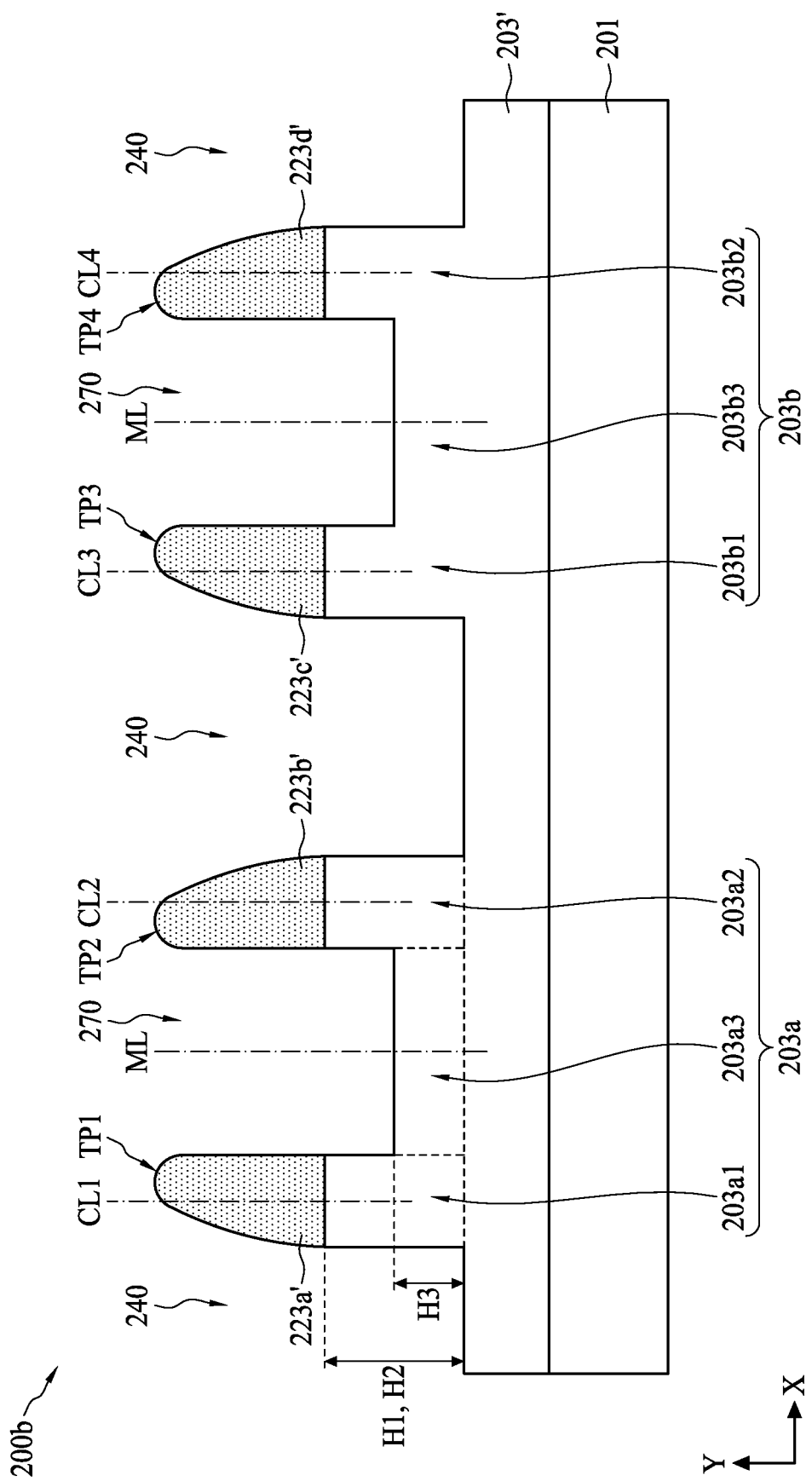
FIG. 2 is a cross-sectional view illustrating an intermediate semiconductor device structure, in accordance with some embodiments.

Specifically, in the cross-sectional view of FIG. 2, the topmost point TP1 of the spacer element 223a' and the topmost point TP2 of the spacer element 223b' are between the central line CL1 and the central line CL2, and the topmost point TP3 of the spacer element 223c' and the topmost point TP4 of the spacer element 223d' are between the central line CL3 and the central line CL4, in accordance with some embodiments.

In some embodiments, recesses 270 are disposed over the first and second target structures 203a and 203b, and recesses 240 are formed between adjacent target structures (e.g., between the first and second target structures 203a and 203b). In some embodiments, the spacer elements 223a' and 223b' are separated by one of the recesses 270, the spacer elements 223c' and 223d' are separated by another of the recesses 270, and the spacer elements 223b' and 223c' are separated by one of the recesses 240. It should be noted that the recesses 240 are deeper than the recesses 270 (i.e., extending to a lower level in the Y-direction), in accordance with some embodiments.

FIG. 2 is a cross-sectional view illustrating an intermediate semiconductor device structure 200b, which is an alternative embodiment of the intermediate semiconductor device structure 200a, in accordance with some embodiments. For consistency and clarity, similar components appearing in both FIGS. 1 and 2 are labeled with same numerals. One difference between the embodiment shown in FIG. 1 and the embodiment shown in FIG. 2 is that the hard mask structures 205a1, 205a2, 205b1 and 205b2 are absent in the embodiment shown in FIG. 2.

Figure 3:
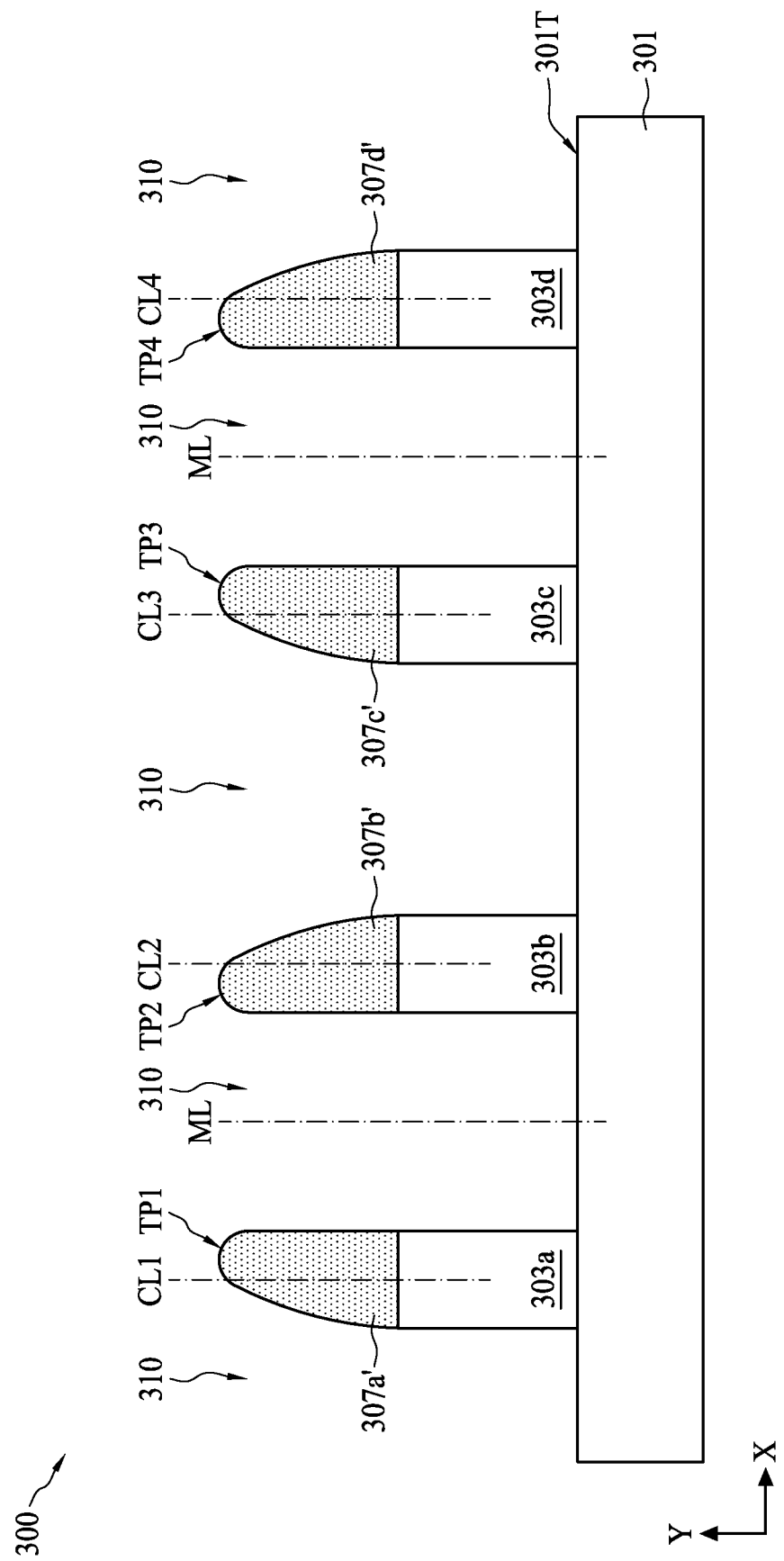
FIG. 3 is a cross-sectional view illustrating an intermediate semiconductor device structure, in accordance with some embodiments.

FIG. 3 is a cross-sectional view illustrating an intermediate semiconductor device structure 300, in accordance with some embodiments. As shown in FIG. 3, the intermediate semiconductor device structure 300 includes target structures 303a, 303b, 303c and 303d disposed over a semiconductor substrate 301, and spacer elements 307a', 307b', 307c' and 307d' disposed over the target structures 303a, 303b, 303c and 303d, in accordance with some embodiments.

In some embodiments, the spacer element 307a' is disposed over the first target structure 303a, the spacer element 307b' is disposed over the second target structure 303b, the spacer element 307c' is disposed over the third target structure 303c, and the spacer element 307d' is disposed over the fourth target structure 303d. Moreover, in some embodiments, each adjacent pair of the spacer elements 307a', 307b', 307c' and 307d' is separated by an opening 310. In some embodiments, each adjacent pair of target structures 303a, 303b, 303c and 303d is separated by one of the openings 310 such that a top surface 301T of the semiconductor substrate 301 is exposed in the opening 310.

As shown in FIG. 3, the first target structure 303a has a central line CL1, the second target structure 303b has a central line CL2, the third target structure 303c has a central line CL3, and the fourth target structure 303d has a central line CL4. Moreover, the spacer element 307a' has a topmost point TP1, the spacer element 307b' has a topmost point TP2, the spacer element 307c' has a topmost point TP3, and the spacer element 307d' has a topmost point TP4.

In some embodiments, as shown in FIG. 3, the topmost point TP1 of the spacer element 307a and the topmost point TP2 of the spacer element 307b' are between the central line CL1 and the central line CL2, and the topmost point TP3 of the spacer element 307c' and the topmost point TP4 of the spacer element 307d' are between the central line CL3 and the central line CL4, in accordance with some embodiments.

Figure 4:
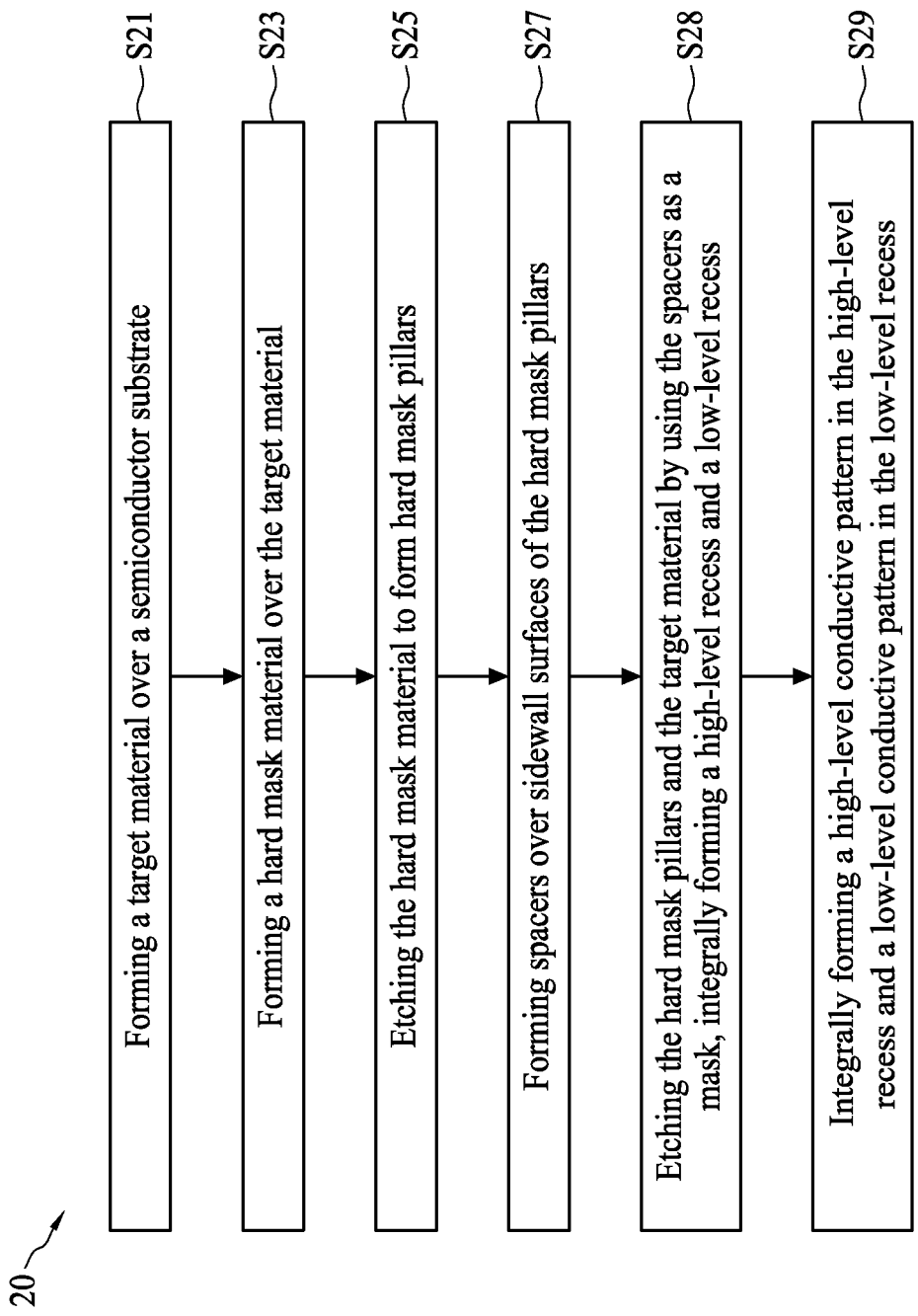
FIG. 4 is a flow diagram illustrating a method of forming an intermediate semiconductor device structure, in accordance with some embodiments.

FIG. 4 is a flow diagram illustrating a method 20 of forming an intermediate semiconductor device structure (e.g., the intermediate semiconductor device structure 200a or 200b), wherein the method 20 includes steps S21, S23, S25, S27, S28 and S29, in accordance with some embodiments.

In accordance with some embodiments, the steps S21 to S29 of FIG. 4 are elaborated in connection with FIGS. 6 to 17, which are cross-sectional views illustrating sequential intermediate stages in the formation of the intermediate semiconductor device structure 200a. In accordance with some other embodiments, the steps S21 to S29 of FIG. 4 are elaborated in connection with FIGS. 6 to 17, which are cross-sectional views illustrating sequential intermediate stages in the formation of the intermediate semiconductor device structure 200b.

Figure 6:
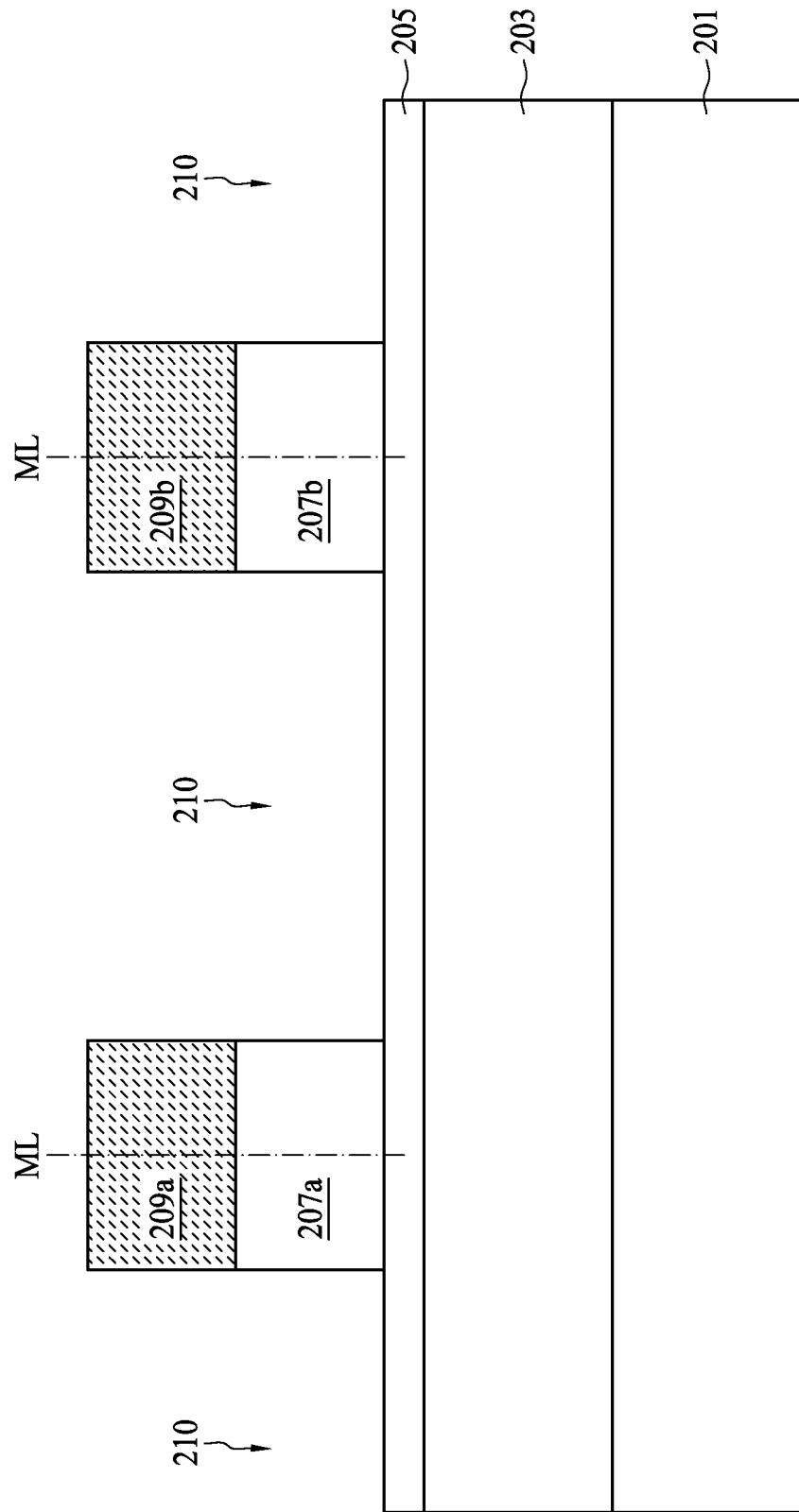
FIG. 6 is a cross-sectional view illustrating an intermediate stage in formation of hard mask pillars and photoresist patterns over a substrate, in accordance with some embodiments.

As shown in FIG. 6, a semiconductor substrate 201 is provided, and a target material 203 is disposed over the semiconductor substrate 201. The respective step is illustrated as the step S21 in the method 20 shown in FIG. 4. Details of the semiconductor substrate 201 of FIG. 6 may be similar to or same as details of the semiconductor substrate 201 of FIG. 1, and descriptions thereof are not repeated herein.

In some embodiments, the target material 203 is a dielectric layer. For example, the target material 203 is made of silicon oxide, silicon carbide, silicon nitride, silicon oxynitride, another suitable dielectric material, or a combination thereof. In some embodiments, the target material 203 includes an interconnect structure, which has one or more metallization layers (e.g., copper layers) formed in the target material 203, and the interconnect structure is used to connect various electrical components to form functional circuitry. In some embodiments, the target material 203 is formed by any suitable process, such as deposition, damascene, and/or dual damascene.

Still referring to FIG. 6, a hard mask layer 205 is disposed over the target material 203, and hard mask pillars 207a and 207b are disposed over the hard mask layer 205 by an etching process using photoresist patterns 209a and 209b as a mask, in accordance with some embodiments. In some embodiments, the hard mask layer 205 and the hard mask pillars 207a, 207b are made of dielectric materials, such as silicon oxide, silicon carbide, silicon nitride, silicon oxynitride, one or more other suitable materials, or a combination thereof.

In some embodiments, the hard mask layer 205 and the hard mask pillars 207a, 207b are formed by a deposition process and an etching process, in accordance with some embodiments. For example, a hard mask material (not shown) may be conformally deposited over a top surface of the target material 203, and the photoresist patterns 209a and 209b are disposed over the hard mask material. After the photoresist patterns 209a and 209b are formed, portions of the hard mask material exposed by the photoresist patterns 209a and 209b are removed by a dry etching process to form openings 210 between adjacent hard mask pillars (e.g., the hard mask pillars 207a and 207b), as shown in FIG. 6. The respective steps are illustrated as the steps S23 and S25 in the method 20 shown in FIG. 4.

It should be noted that the target material 203 is not exposed by the openings 210, in accordance with some embodiments. Moreover, the hard mask layer 205 and the hard mask pillars 207a, 207b are made of a same material and are formed simultaneously, in accordance with some embodiments. After the openings 210 are obtained, the photoresist patterns 209a and 209b may be removed.

Figure 7:
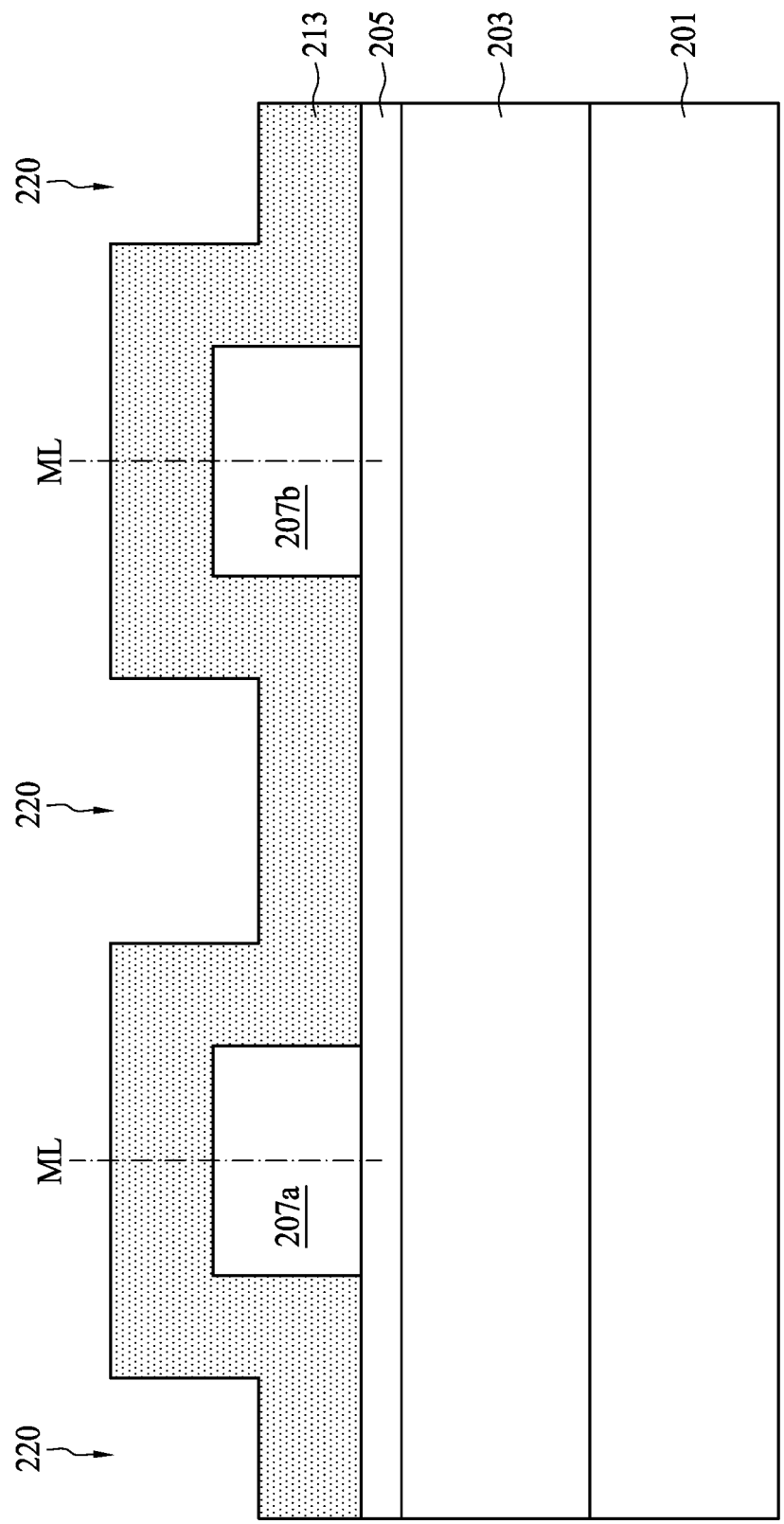
FIG. 7 is a cross-sectional view illustrating an intermediate stage in formation of a conformal spacer material over the substrate, in accordance with some embodiments.

Referring to FIG. 7, in some embodiments, after the photoresist patterns 209a and 209b are removed, a spacer material 213 is conformally deposited over top surfaces and sidewall surfaces of the hard mask pillars 207a, 207b and a top surface of the hard mask layer 205, such that reduced openings 220 are obtained in accordance with some embodiments.

In some embodiments, the spacer material 213 is made of silicon oxide, silicon carbide, silicon nitride, silicon oxynitride, another suitable material, or a combination thereof, and the deposition process for forming the spacer material 213 includes a CVD process, a physical vapor deposition (PVD) process, an atomic layer deposition (ALD) process, a spin-on process, or another suitable process. In some embodiments, the material of the spacer material 213 is different from the material of the hard mask pillars 207a and 207b. It should be noted that the material of the hard mask pillars 207a and 207b has a high etching selectivity against the material of the spacer material 213.

Figure 8:
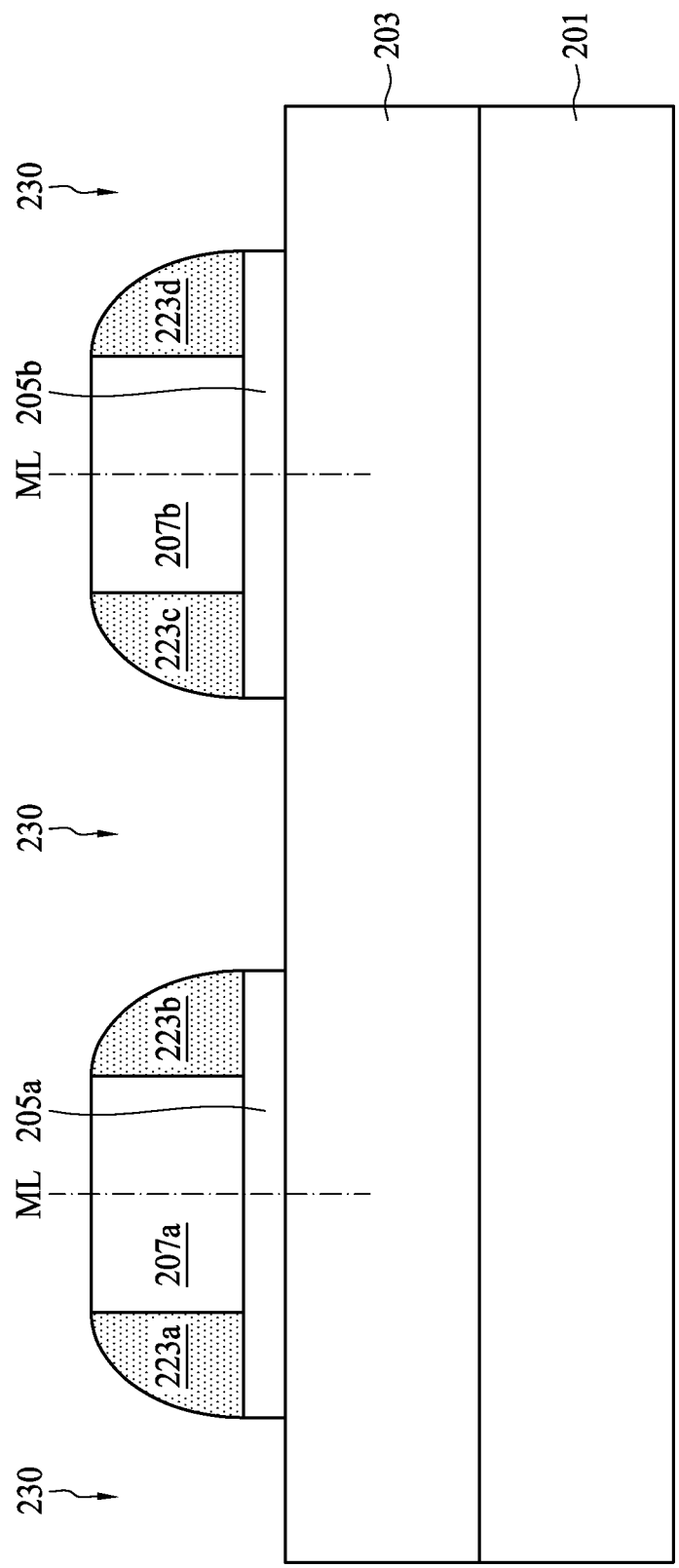
FIG. 8 is a cross-sectional view illustrating an intermediate stage in formation of a spacer element over the substrate, in accordance with some embodiments.

Referring to FIG. 8, in some embodiments, the spacer material 213 is etched to form spacers 223a, 223b, 223c and 223d over the sidewall surfaces of the hard mask pillars 207a, 207b in accordance with some embodiments. The respective steps are illustrated as the step S27 in the method 20 shown in FIG. 4. In some embodiments, the etching process is an anisotropic etching process, which removes a same amount of the spacer material 213 vertically in all places, leaving the spacers 223a, 223b, 223c and 223d over the sidewall surfaces of the hard mask pillars 207a and 207b. In some embodiments, the etching process is a dry etching process.

Moreover, portions of the hard mask layer 205 between the hard mask pillars 207a and 207b are removed to form hard mask portions 205a and 205b, and openings 230 are obtained between adjacent hard mask portions (e.g., the hard mask portions 205a and 205b), as shown in FIG. 8 in accordance with some embodiments. In some embodiments, the target material 203 is exposed by the openings 230. In some embodiments, the spacers 223a, 223b, 223c and 223d are separated from the target material 203 by the hard mask portions 205a and 205b.

Figure 9:
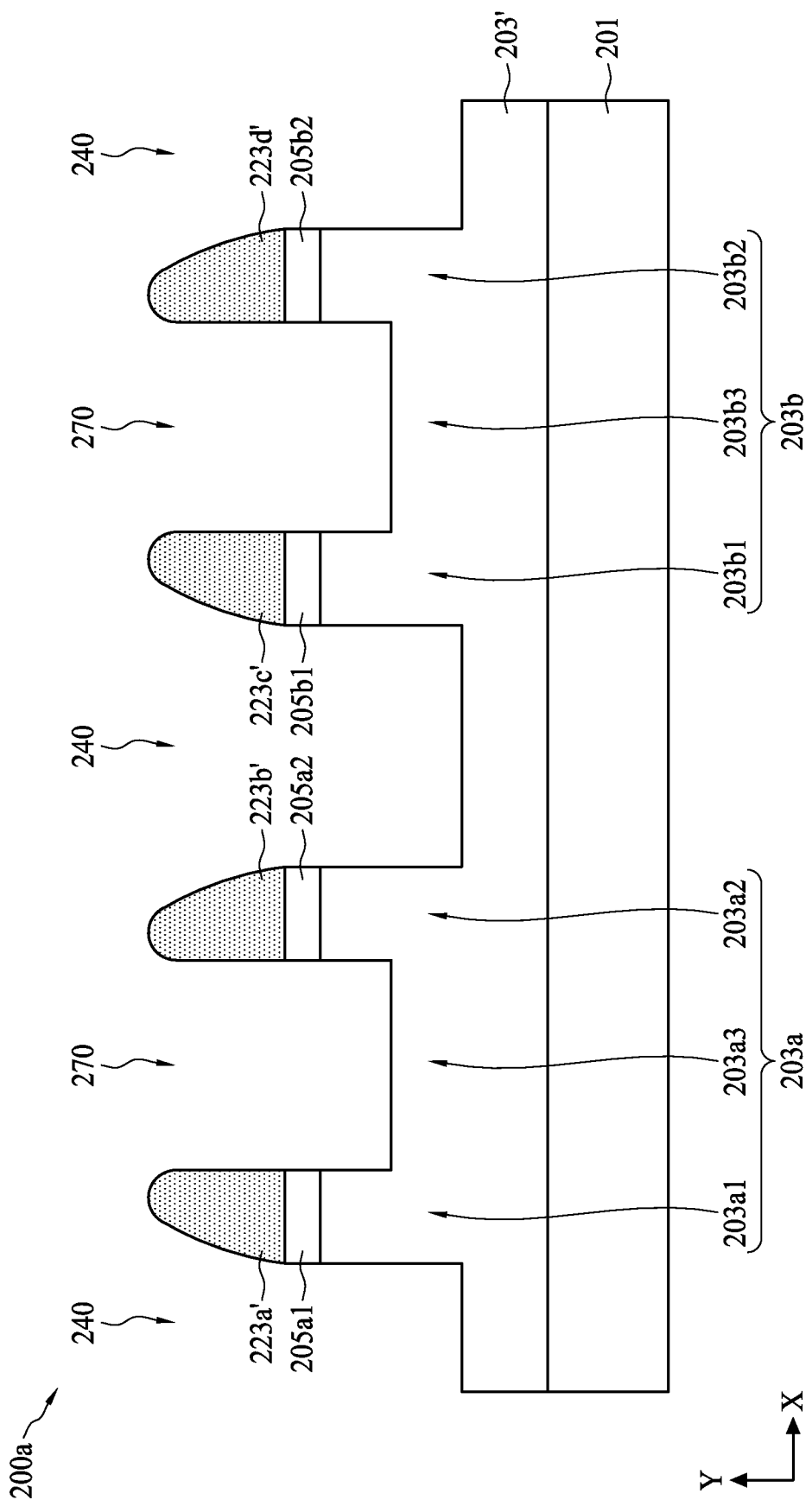
FIG. 9 is a cross-sectional view illustrating an intermediate stage in formation of a plurality of recesses over the substrate, in accordance with some embodiments.

Referring to FIG. 9, in some embodiments, the hard mask pillars 207a, 207b, the hard mask portions 205a, 205b, and the target material 203 are etched using the spacers 223a, 223b, 223c, 223d as a mask, integrally forming a high-level recess (shallow opening) 270 and a low-level recess (deep opening) 240, in accordance with some embodiments. The respective steps are illustrated as the step S29 in the method 20 shown in FIG. 4. In some embodiments, the etching process is a dry etching process.

In some embodiments, the hard mask pillars 207a, 207b are entirely removed, the hard mask structures 205a1, 205a2, 205b1 and 205b2 are formed by etching the hard mask portions 205a, 205b and the target layer 203', and first and second target structures 203a, 203b are formed over the target layer 203' by etching the target material 203, in accordance with some embodiments. In addition, the spacers 223a, 223b, 223c and 223d are slightly etched to form spacer elements 223a', 223b', 223c' and 223d'. It should be noted that the material of the hard mask pillars 207a, 207b has a high etching selectivity against the material of the spacers 223a, 223b, 223c, 223d (i.e., the material of the spacer elements 223a', 223b', 223c' and 223d') during the etching process.

The material of the hard mask pillars 207a, 207b has a first etching selectivity against the material of the spacers 223a, 223b, 223c, 223d; the material of the hard mask portions 205a, 205b has a second etching selectivity against the material of the spacers 223a, 223b, 223c, 223d; and the material of the target material 203 has a third etching selectivity against the material of the spacers 223a, 223b, 223c, 223d. In some embodiments, the first etching selectivity, the second etching selectivity and the third etching selectivity are similar to each other.

Since the top surfaces of the hard mask pillars 207a, 207b are higher than the top surface of the target material 203 before the etching process, the low-level recess 240 is deeper than the high-level recesses 270 after the etching process, in accordance with some embodiments. As a result, the spacer elements 223a', 223b', 223c' and 223d' may be prevented from collapsing due to support provided by the underlying target structures 203a and 203b, which are U-shaped structures protruding from the target layer 203'.

Moreover, the hard mask pillars 207a, 207b, the hard mask portions 205a, 205b, and the target material 203 have high etching selectivities against the spacers 223a, 223b, 223c, 223d in the etching process for forming the spacer elements 223a', 223b', 223c', 223d'. As a result, the spacer elements 223a', 223b', 223c' and 223d' may be further prevented from collapsing.

Figure 10:
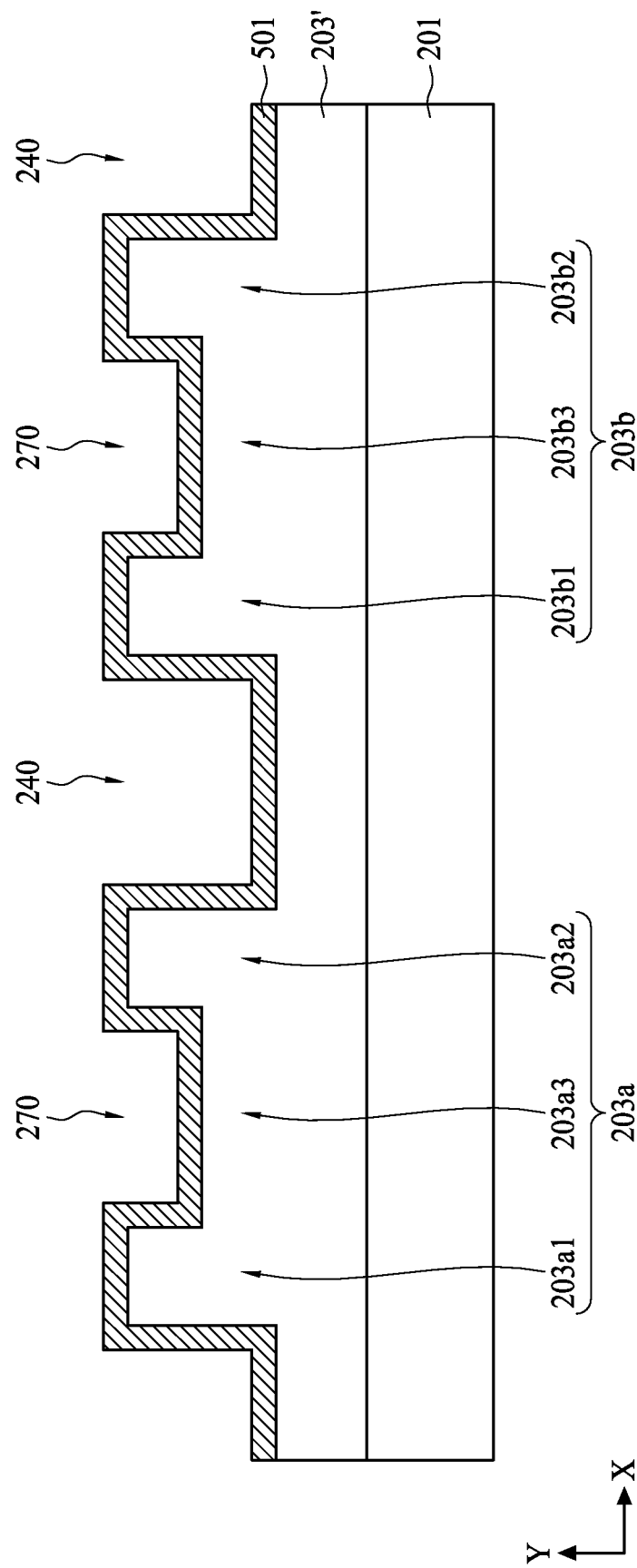
FIG. 10 is a cross-sectional view illustrating an intermediate stage in formation of a first spacer layer over the substrate, in accordance with some embodiments.

Referring to FIG. 10, in some embodiments, the spacer elements 223a', 223b', 223c', 223d' and the hard mask structures 205a1, 205a2, 205b1, 205b2 are removed, leaving the target layer 203' with the target structures 203a, 203b over the substrate 201. In some embodiments, the high-level recesses 270 are formed over the target structures 203a and 203b, and the low-level recesses 240 are formed between adjacent target structures 203a and 203b.

Subsequently, a first spacer layer 501 may be formed to cover the target structures 203a and 203b. In some embodiments, the first spacer layer 501 may be formed of doped oxide such as borosilica glass, phosphosilica glass, borophosphosilica glass, fluoride silicate glass, carbon doped silicon oxide, or the like. Alternatively, in another embodiment, the first spacer layer 501 may be formed of a thermal decomposable polymer or a thermal degradable polymer.

Figure 11:
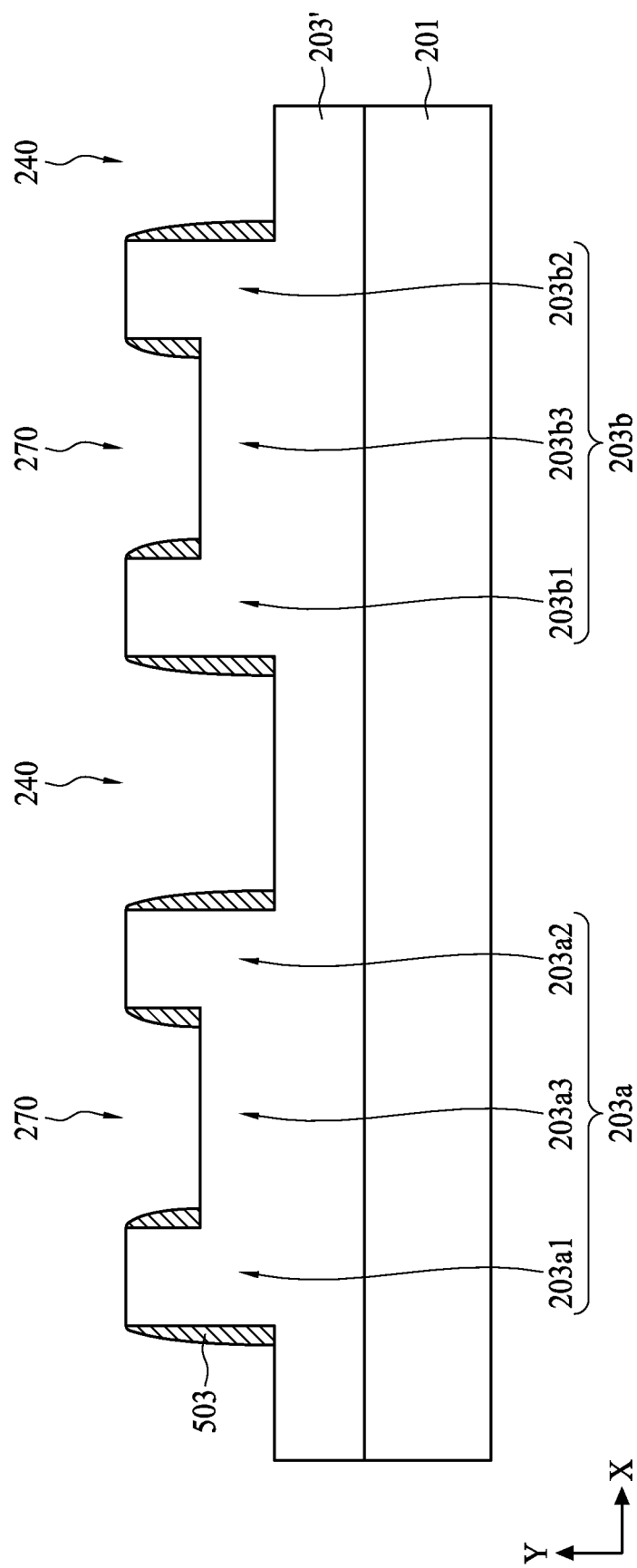
FIG. 11 is a cross-sectional view illustrating an intermediate stage in formation of a plurality of first spacers over the substrate, in accordance with some embodiments.

Referring to FIG. 11, in some embodiments, an etch process, such as an anisotropic dry etch process, may be performed to form a plurality of first spacers 503 attached to sidewalls of the first portion 203a1 of the first target structure 203a, sidewalls of the second portion 203a2 of the first target structure 203a, sidewalls of the fourth portion 203b1 of the second target structure 203b, and sidewalls of the fifth portion 203b2 of the second target structure 203b.

Figure 12:
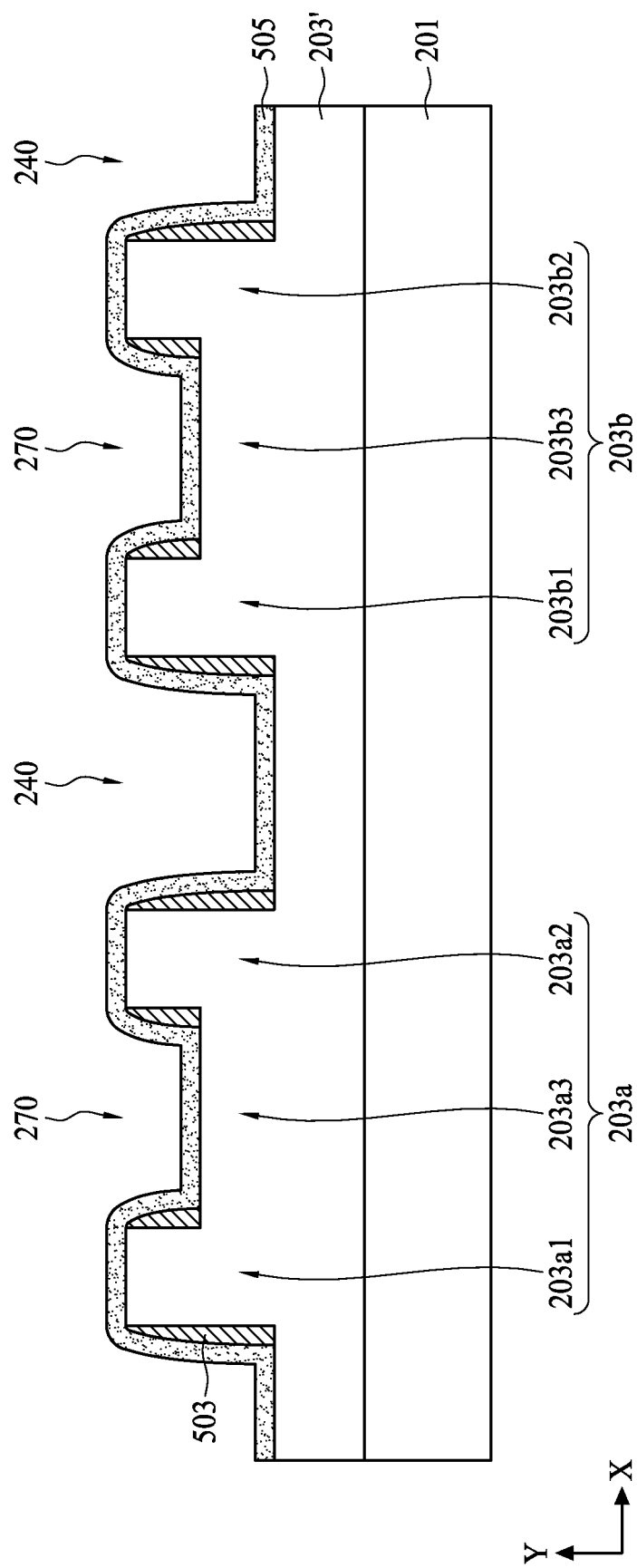
FIG. 12 is a cross-sectional view illustrating an intermediate stage in formation of a second spacer layer over the substrate, in accordance with some embodiments.

Referring to FIG. 12, in some embodiments, a second spacer layer 505 may be formed to cover the target structures 203a and 203b and the plurality of first spacers 503. In some embodiments, the second spacer layer 505 may be formed of, for example, silicon nitride.

Figure 13:
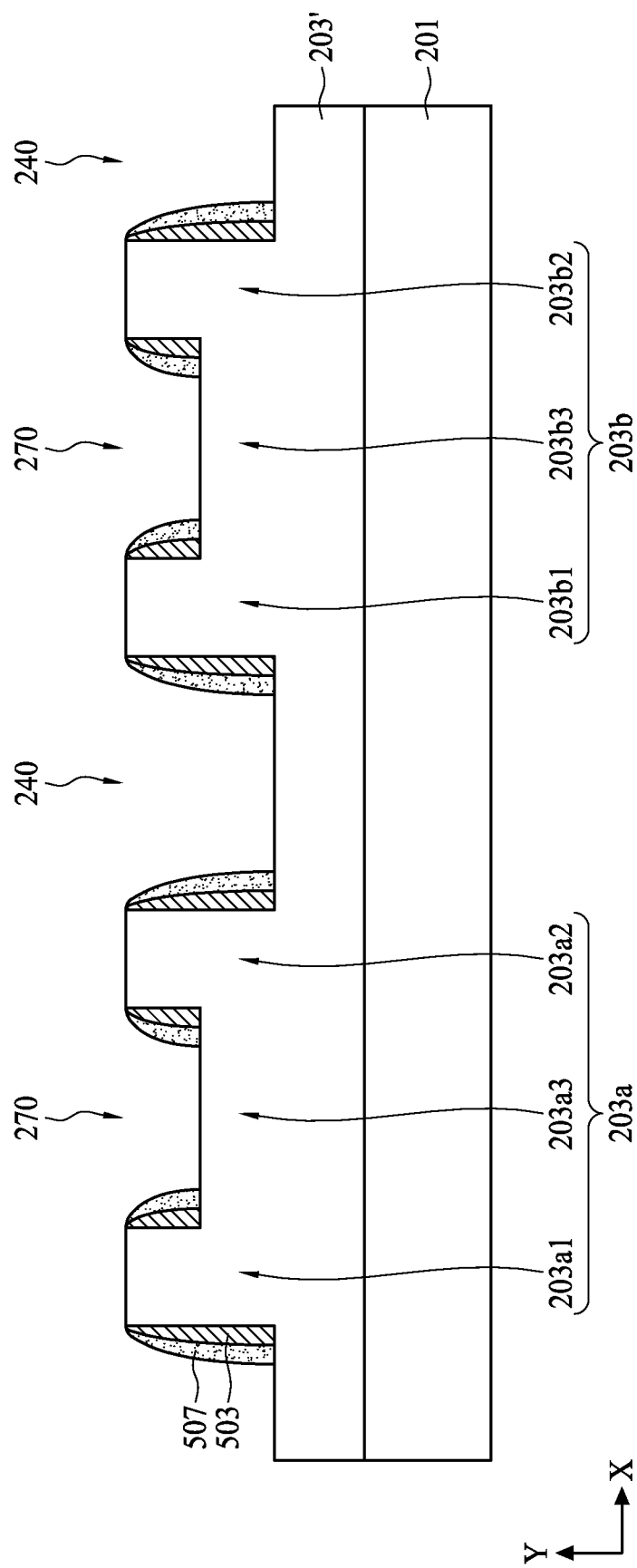
FIG. 13 is a cross-sectional view illustrating an intermediate stage in formation of a plurality of second spacers over the substrate, in accordance with some embodiments.

Referring to FIG. 13, in some embodiments, an etch process, such as an anisotropic dry etch process, may be performed to form a plurality of second spacers 507 attached to surfaces of the plurality of first spacers 503.

Figure 14:
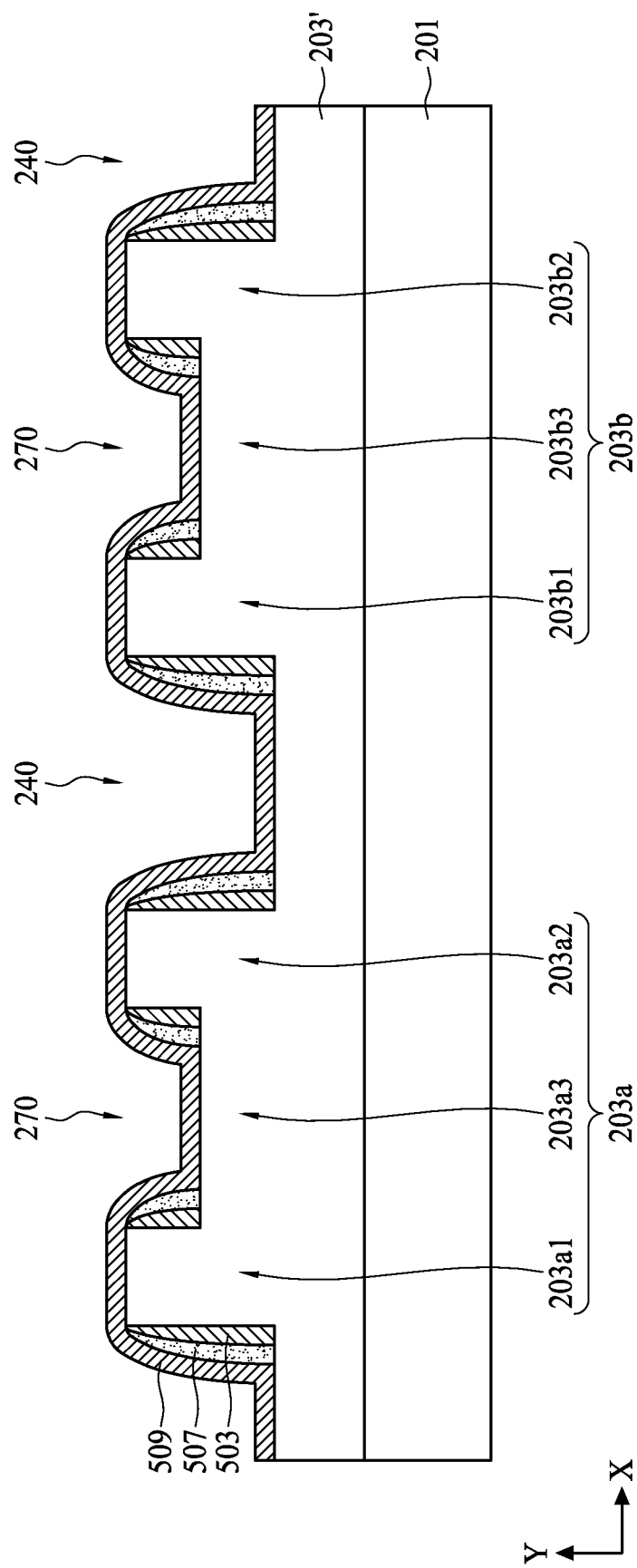
FIG. 14 is a cross-sectional view illustrating an intermediate stage in formation of a liner layer over the substrate, in accordance with some embodiments.

Referring to FIG. 14, in some embodiments, a liner layer 509 may be formed to cover the target structures 203a and 203b and the plurality of second spacers 507. In some embodiments, the liner layer 509 may be formed of, for example, titanium, titanium nitride, titanium silicon nitride, tantalum, tantalum nitride, tantalum silicon nitride, or a combination thereof.

Figure 15:
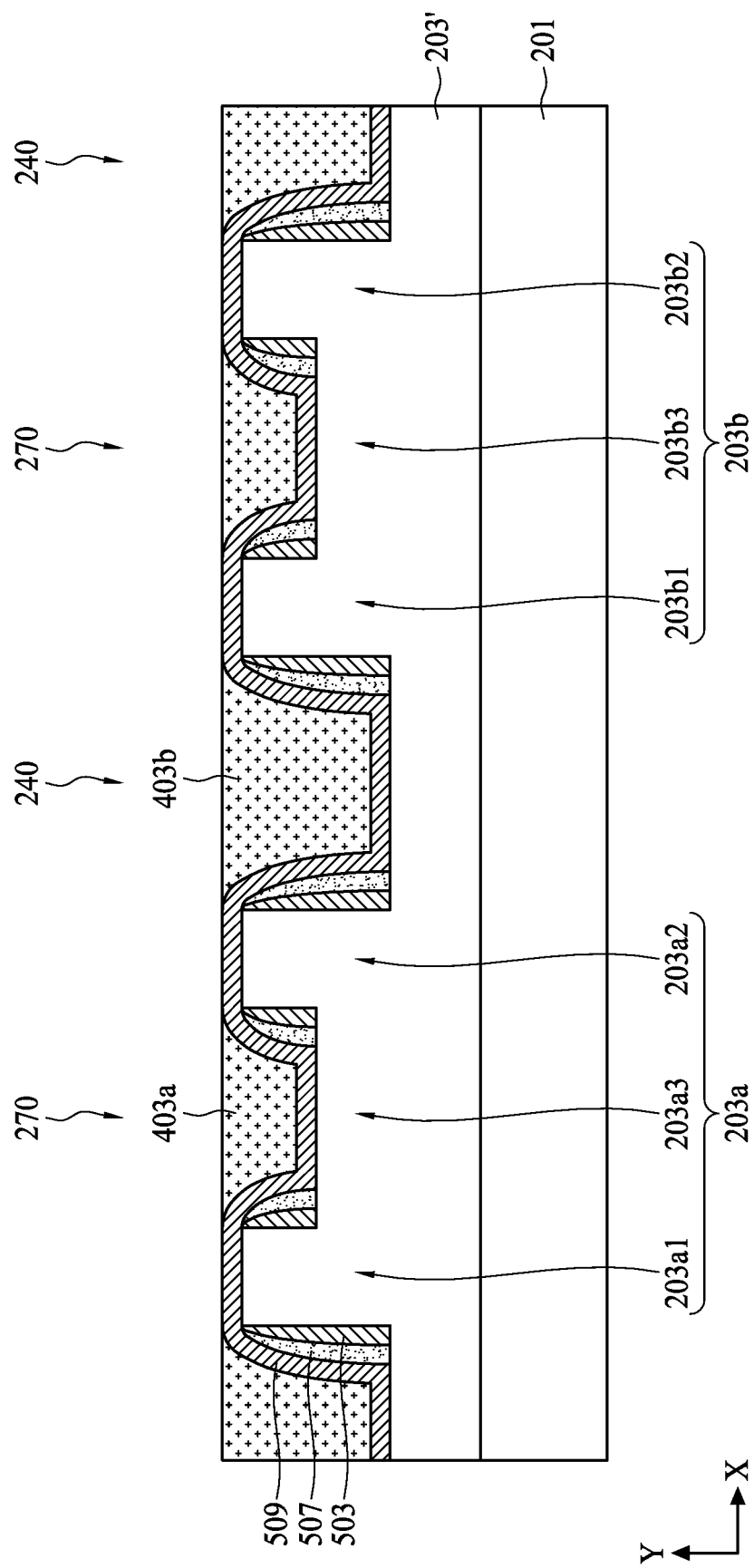
FIG. 15 is a cross-sectional view illustrating an intermediate stage in formation of a high-level conductive pattern and a low-level conductive pattern over the substrate, in accordance with some embodiments.

Referring to FIG. 15, in some embodiments, a conductive material, for example, doped polysilicon, metal, metal nitride, or metal silicide, may be deposited into the low-level recesses 240 and the high-level recesses 270 by a metallization process. In the embodiment depicted, the conductive material may be tungsten. After the metallization process, a planarization process, such as chemical mechanical polishing, may be performed to remove excess filling material above the liner layer 509, provide a substantially flat surface for subsequent processing steps, and integrally form a high-level conductive pattern 403a in the high-level recess 270 and a low-level conductive pattern 403b in the low-level recess 240. In some embodiments, the high-level conductive pattern 403a and the low-level conductive pattern 403b are conductive patterns serving as conductive contacts having bottom ends at different levels for contacting terminals at different levels.

In some embodiments, the bottom end of the high-level conductive pattern 403a electrically contacts a gate terminal of a planar transistor, and the bottom end of the low-level conductive pattern 403b electrically contacts a source/drain terminal of the planar transistor, wherein the gate terminal is disposed at a relatively high level, and the source/drain terminal is disposed at a relatively low level.

Figure 16:
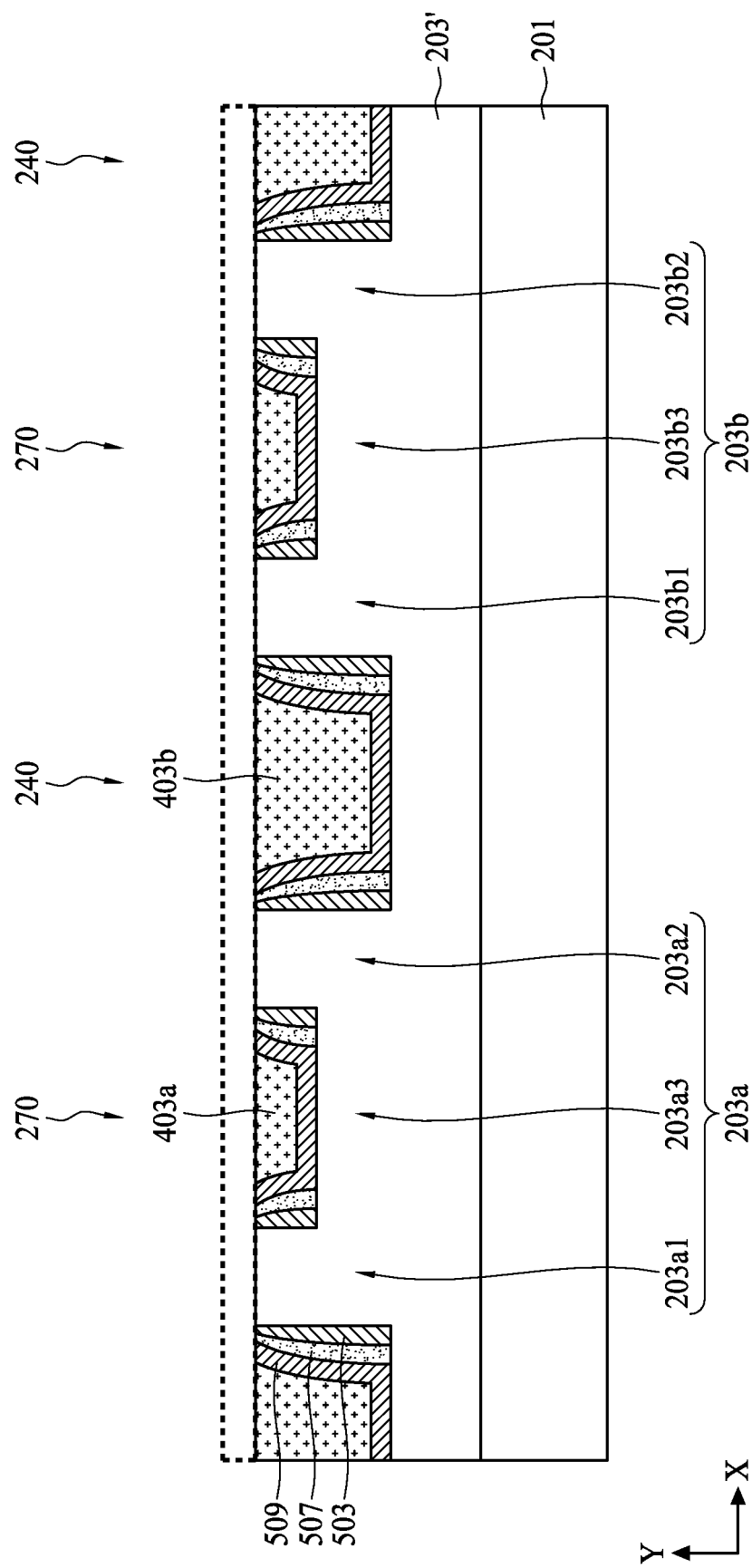
FIG. 16 is a cross-sectional view illustrating an intermediate stage of performing a planarization process over the substrate, in accordance with some embodiments.
Figure 17:
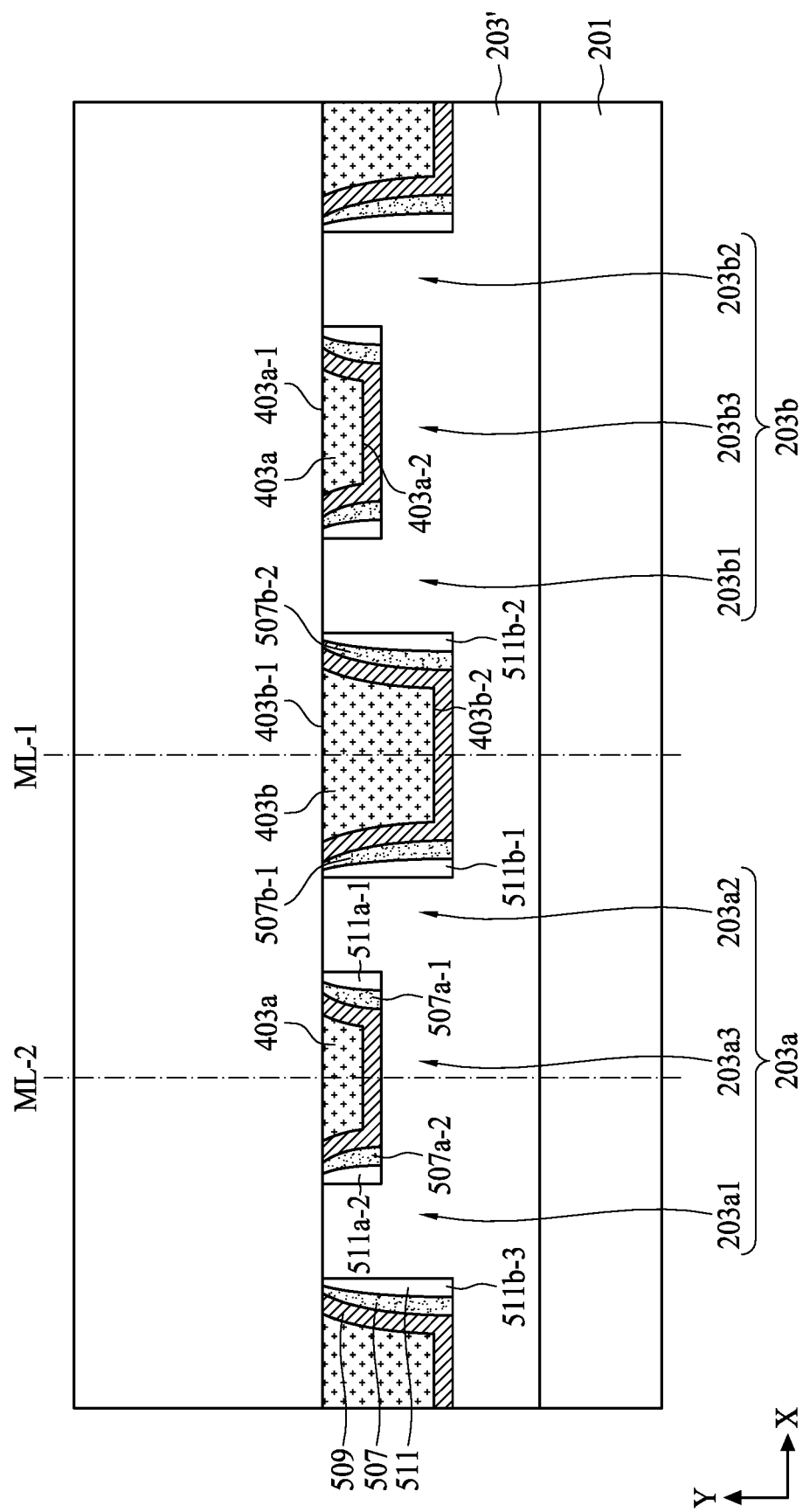
FIG. 17 is a cross-sectional view illustrating an intermediate stage in formation of a plurality of air gaps over the substrate, in accordance with some embodiments.

Referring to FIGS. 16 and 17, in some embodiments, a plurality of air gaps 511 may be formed above the substrate 201. With reference to FIG. 16, a planarization process, such as chemical mechanical polishing, may be performed to remove part of the liner layer 509 above the first target structure 203a (the first portion 203a1 and the second portion 203a2) and the second target structure 203b (the fourth portion 203b1 and the fifth portion 203b2). Top surfaces of the plurality of first spacers 503 disposed adjacent to the first portion 203a1 and the second portion 203a2 of the first target structure 203a and adjacent to the fourth portion 203b1 and the fifth portion 203b2 of the second target structure 203b may be exposed after the planarization process.

With reference to FIG. 17, the plurality of first spacers 503 disposed adjacent to the first portion 203a1 and the second portion 203a2 of the first target structure 203a and adjacent to the fourth portion 203b1 and the fifth portion 203b2 of the second target structure 203b may be removed to form the plurality of air gaps 511. In some embodiments, a passivation layer (not shown) is formed to seal the plurality of air gaps 511. In some embodiments, a vapor hydrogen fluoride may be introduced and may etch the plurality of first spacers 503 disposed adjacent to the first portion 203a1 and the second portion 203a2 of the first target structure 203a and adjacent to the fourth portion 203b1 and the fifth portion 203b2 of the second target structure 203b.

In some embodiments, the vapor hydrogen fluoride has a higher etching rate on the plurality of first spacers 503 formed of doped oxide; therefore, the plurality of first spacers 503 disposed adjacent to the first portion 203a1 and the second portion 203a2 of the first target structure 203a and adjacent to the fourth portion 203b1 and the fifth portion 203b2 of the second target structure 203b may be selectively removed, while the plurality of second spacers 507 formed of silicon nitride may be selectively retained. The plurality of second spacers 507 may prevent the material of the high-level conductive pattern 403a in the high-level recess 270 and the material of the low-level conductive pattern 403b in the low-level recess 240 from flowing into the plurality of air gaps 511 during subsequent processing steps such as heat treatment.

With reference to FIG. 17, alternatively, in another embodiment, a heat process is applied to remove the plurality of first spacers 503 formed of thermal-decomposable polymer or thermal degradable polymer. A temperature of the heat process may be between about 300° C. and about 450° C. In some embodiments, the temperature of the heat process may be between about 350° C. and about 420° C.

Referring to FIG. 17, in some embodiments, the high-level conductive pattern 403a is positioned between the first portion 203a1 and the second portion 203a2 of the first target structure 203a. In some embodiments, the low-level conductive pattern 403b has a first top end 403b-1 and a first bottom end 403b-2, the high-level conductive pattern 403a has a second top end 403a-1 and a second bottom end 403a-2, the first bottom end 403b-2 is lower than the second bottom end 403a-2, and the first top end 403b-1 and the second top end 403a-1 are substantially at a same level.

Referring to FIG. 17, in some embodiments, the intermediate semiconductor device structure further comprises a first tall air gap 511b-1 between the first target structure 203a and the low-level conductive pattern 403b, and a second tall air gap 511b-2 between the second target structure 203b and the low-level conductive pattern 403b. In some embodiments, the first tall air gap 511b-1 and the second tall air gap 511b-2 have spacer profiles in the cross-sectional view of FIG. 17. In some embodiments, the first tall air gap 511b-1 and the second tall air gap 511b-2 are substantially symmetric with respect to a middle line ML-1 between the first target structure 203a and the second target structure 203b.

Referring to FIG. 17, in some embodiments, the intermediate semiconductor device structure further comprises a third tall air gap 511b-3, wherein the first tall air gap 511b-1 is positioned on a sidewall of the second portion 203a2 of the first target structure 203a, and the third tall air gap 511b-3 is positioned on a sidewall of the first portion 203a1 of the first target structure 203a. In some embodiments, the first tall air gap 511b-1 and the third tall air gap 511b-3 are substantially symmetric with respect to a middle line ML-2 between the first portion 203a1 and the second portion 203a2 of the first target structure 203a.

Referring to FIG. 17, in some embodiments, the intermediate semiconductor device structure further comprises a first tall dielectric spacer 507b-1 positioned between the first tall air gap 511b-1 and the low-level conductive pattern 403b, and a second tall dielectric spacer 507b-2 positioned between the second tall air gap 511b-2 and the low-level conductive pattern 403b. In some embodiments, the first tall dielectric spacer 507b-1 and the second tall dielectric spacer 507b-2 are substantially symmetric with respect to the middle line ML-1 between the first target structure 203a and the second target structure 203b.

Referring to FIG. 17, in some embodiments, the intermediate semiconductor device structure further comprises a first short air gap 511a-1 and a first short dielectric spacer 507a-1 positioned between the first short air gap 511a-1 and the high-level conductive pattern 403a. In some embodiments, the intermediate semiconductor device structure comprises the first short air gap 511a-1 and a second short air gap 511a-2 positioned at two sides of the high-level conductive pattern 403a. In some embodiments, the first short air gap 511a-1 and the second short air gap 511a-2 are substantially symmetric with respect to the middle line ML-2 between the first portion 203a1 and the second portion 203a2 of the first target structure 203a. In some embodiments, the intermediate semiconductor device structure further comprises a second short dielectric spacer 507a-2 positioned between the second short air gap 511a-2 and the high-level conductive pattern 403a.

Referring to FIG. 17, in some embodiments, the first tall air gap 511b-1 is positioned between the low-level conductive pattern 403b and the second portion 203a2, and the first short air gap 511a-1 is positioned between the high-level conductive pattern 403a and the second portion 203a2. In some embodiments, the first tall air gap 511b-1 and the first short air gap 511a-1 have spacer profiles in the cross-sectional view of FIG. 17. In some embodiments, the first portion 203a1 and the second portion 203a2 are substantially symmetric with respect to the middle line ML-2 between the first portion 203a1 and the second portion 203a2.

After the formation of the air gaps 511, the passivation layer 513 may be removed. The removal of the passivation layer 513 may be performed using an etching process, a grinding process, or the like. At such time, the intermediate semiconductor device structure 200a has been formed by a manufacturing method according to some embodiments of the present disclosure and may undergo further manufacturing processes (e.g., following steps S41 to S55) and/or testing processes.

Figure 18:
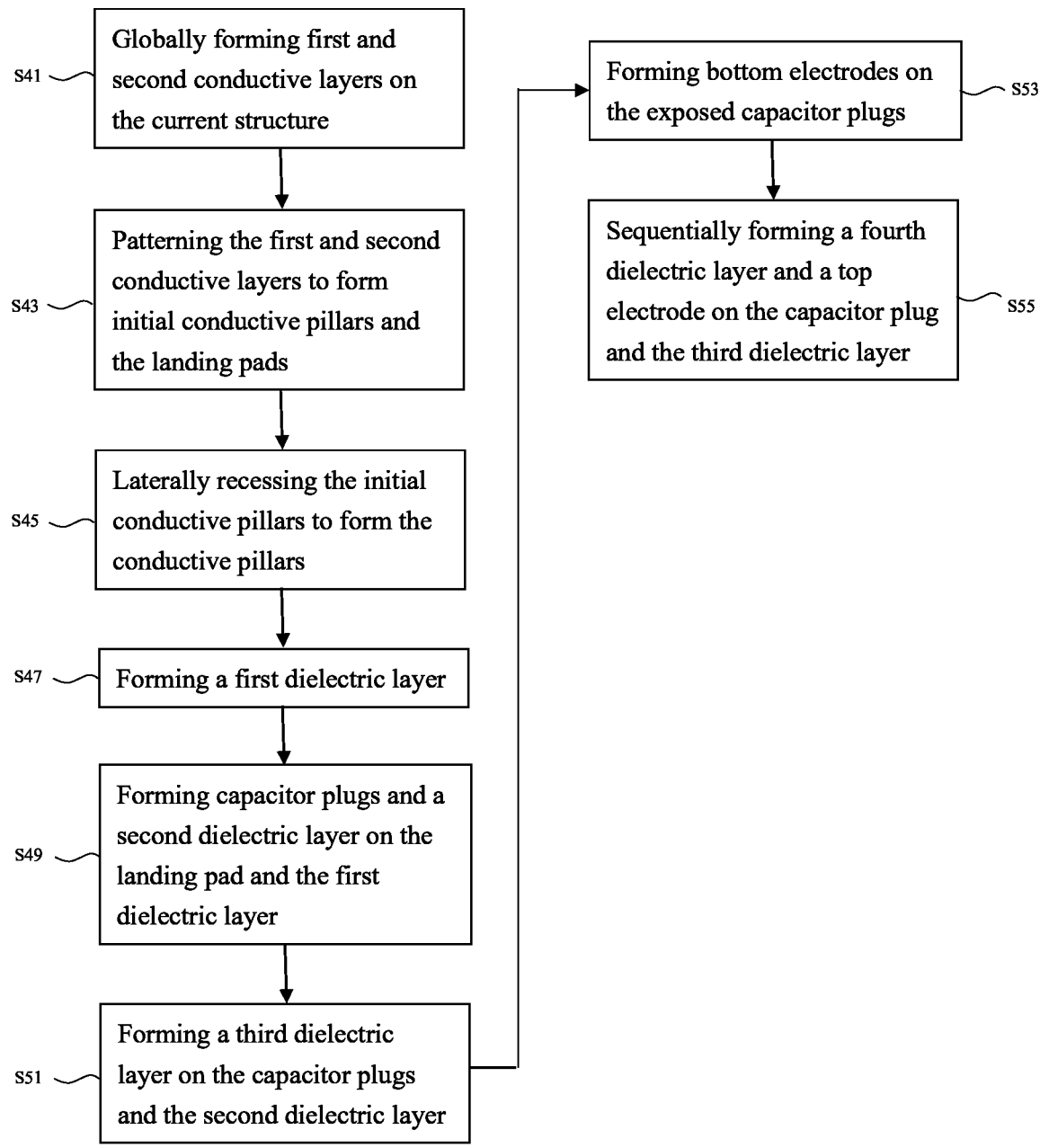
FIG. 18 is a flow diagram illustrating a method of forming a semiconductor device structure, in accordance with some embodiments.

FIG. 18 is a flow diagram illustrating a method of forming a semiconductor device structure, in accordance with some embodiments. FIG. 19A through FIG. 19H are schematic cross-sectional views illustrating structures at various stages during the manufacturing of the semiconductor device structure (e.g. a memory device as shown in FIG. 19H).

Figure 19A:
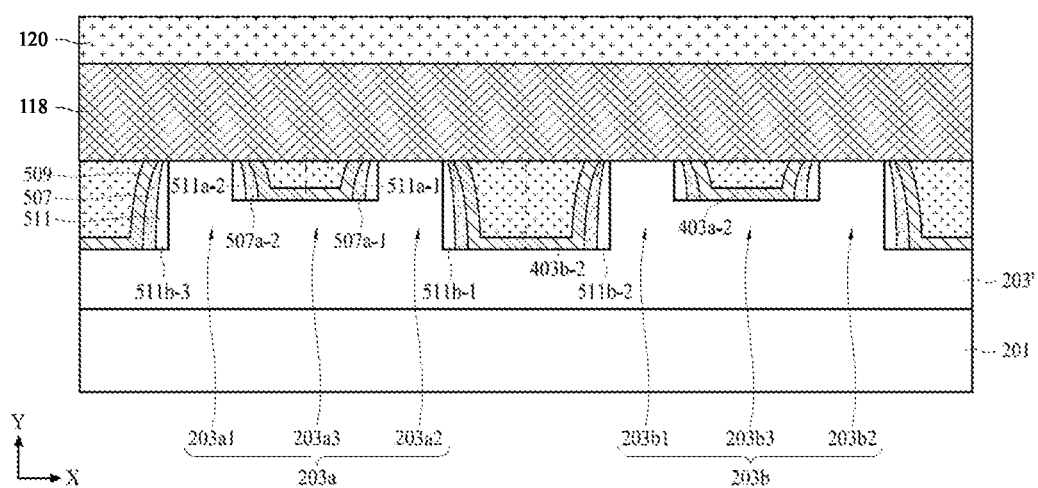
FIG. 19A through FIG. 19H are schematic cross-sectional views illustrating structures at various stages during manufacture of a semiconductor device structure (e.g., a memory device as shown in FIG. 19H).

Referring to FIGS. 18 and 19A, step S41 is performed, and first and second conductive layers 118, 120 are globally formed on the semiconductor device structure of FIG. 17. In other words, the target layer 203', the high-level conductive patterns 403a, the low-level conductive patterns 403b, and the first and second target structures 203a and 203b may be covered by the first and second conductive layers 118 and 120. The second conductive layer 120 is stacked on the first conductive layer 118. In subsequent steps, conductive pillars 116 and landing pads LP will be formed by patterning the first and second conductive layers 118 and 120. In some embodiments, the first conductive layer 118 has a thickness greater than a thickness of the second conductive layer 120. In addition, in some embodiments, a conductive material for forming the second conductive layer 120 has a resistivity less than a resistivity of a conductive material for forming the first conductive layer 118, and the conductive material for forming the first conductive layer 118 has a sufficient etching selectivity with respect to the conductive material for forming the second conductive layer 120. A method for forming each of the conductive layers 118, 120 may include a deposition process (e.g., a PVD process), a plating process, or a combination thereof.

Figure 19B:
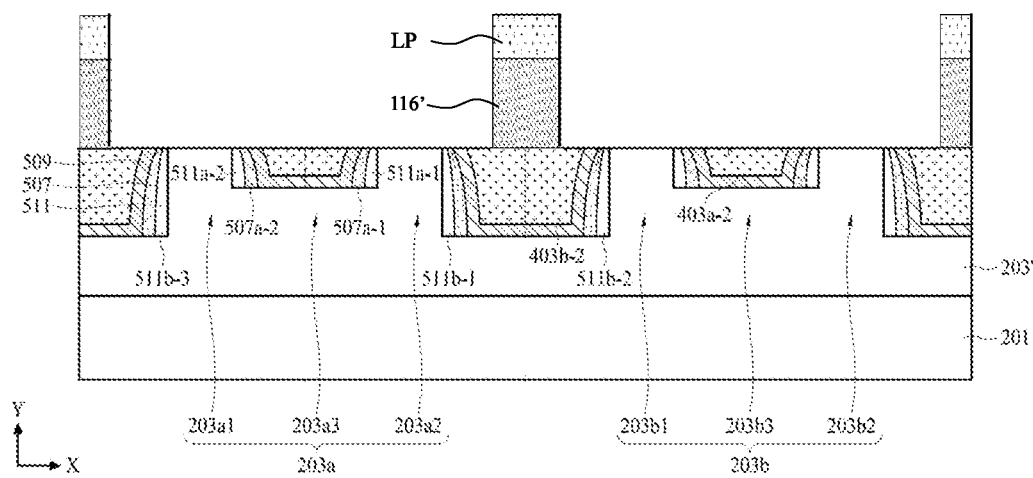

Referring to FIGS. 18 and 19B, step S43 is performed, and the first and second conductive layers 118 and 120 are patterned to form initial conductive pillars 116' and the landing pads LP. During such patterning, portions of the first and second conductive layers 118, 120 are removed, and the high-level conductive pattern 403a as well as portions of the target layer 203' may be exposed. Sidewalls of the initial conductive pillars 116' may be substantially coplanar with sidewalls of the landing pads LP. In other words, a footprint area of each initial conductive pillar 116' may be substantially identical to a footprint area of its overlying landing pad LP. The conductive pillars 116 will be formed by laterally recessing the initial conductive pillars 116' in the following step. In some embodiments, a method for forming the initial conductive pillars 116' and the landing pads LP may include a lithography process and a single etching process (e.g., a single anisotropic etching process). In such embodiments, the first and second conductive layers 118 and 120 are partially removed in the single etching process. In alternative embodiments, a method for forming the initial conductive pillars 116' and the landing pads LP uses two etching processes (e.g., two anisotropic etching processes), wherein a first etching process is performed for forming the landing pads LP, and a subsequent second etching process is performed for forming the initial conductive pillars 116'.

Figure 19C:
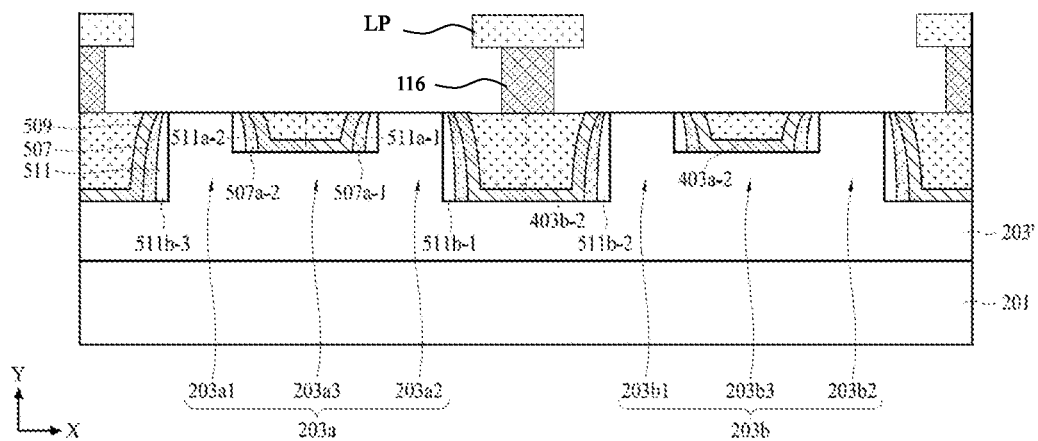

Referring to FIGS. 18 and 19C, step S45 is performed, and the initial conductive pillars 116' are laterally recessed, so as to form the conductive pillars 116. In some embodiments, a method for the lateral recessing of the initial conductive pillars 116' includes an isotropic etching process (e.g., a wet etching process). In those embodiments where the conductive material for forming the landing pads LP has a sufficient etching selectivity with respect to the conductive material for forming the initial conductive pillars 116', the landing pads LP may avoid being damaged (or may be only slightly consumed) during such isotropic etching process. As a consequence, the formed conductive pillars 116 can be laterally recessed with respect to the landing pads LP. That is, a footprint area of the landing pad LP is greater than a footprint area of the conductive pillar 116.

Figure 19D:
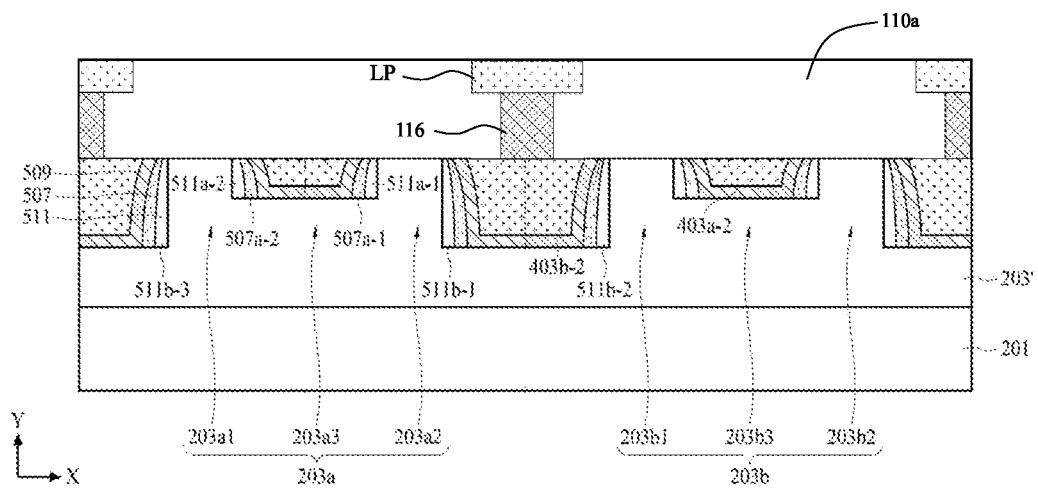
Figure 20:
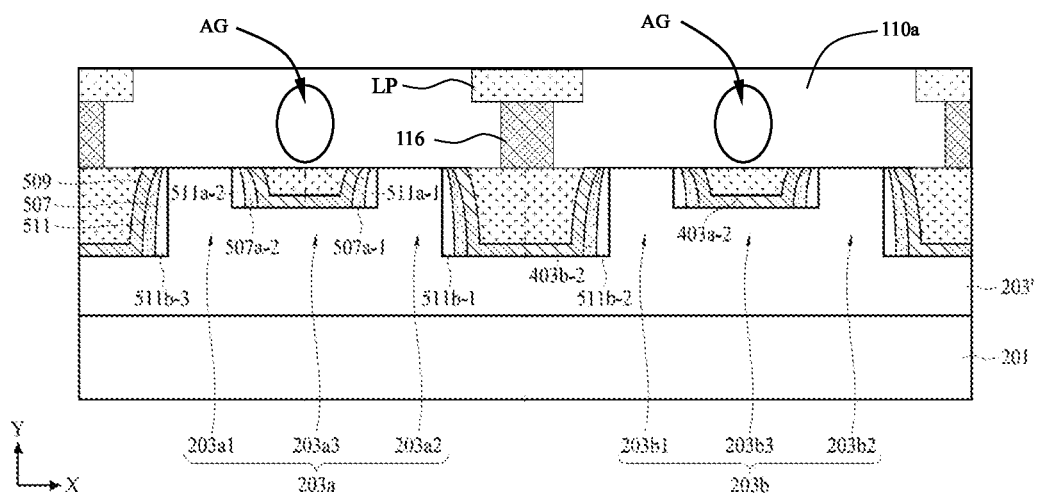
FIG. 20 is another schematic cross-sectional view of a structure at the stage illustrated in FIG. 19D.

Referring to FIGS. 18 and 19D, step S47 is performed, and a first dielectric layer 110a is formed. The conductive pillars 116 and the landing pads LP form stacked structures on the low-level conductive patterns 403b, and define recesses between the stacked structures. The dielectric layer 110a is deposited in the recesses defined by the stacked structures. In some embodiments, a method for forming the dielectric layer 110a includes a deposition process (e.g., a CVD process), and may further include a planarization process for removing excess material above the landing pads LP. As shown in FIG. 20, the dielectric layer 110a may not completely fill the narrow recesses arranged along the column direction (i.e., the direction D2). Since the conductive pillars 116 are laterally recessed from the landing pads LP, a space between adjacent landing pads LP is shorter than a space between adjacent conductive pillars 116. In other words, the recesses defined between the stacked structures respectively have a relatively narrow top portion and a relatively wide bottom portion. When the dielectric layer 110*a* is deposited in the narrow recesses (i.e., the recesses arranged along the direction D2), the relatively narrow top portions of the recesses may be sealed before the relatively wide bottom portions of the recesses can be completely filled. That is, a lateral distance between the landing pads LP is shorter than a lateral distance between the conductive pillars 116. As a consequence, air gaps AG may be formed in the relatively wide bottom portions. In other words, the possibly formed air gaps AG are located between the conductive pillars 116 arranged along the column direction (i.e., the direction D2). As dimensions of the recesses, deposition conditions, and other parameters vary, the air gaps AG may be formed in different shapes, and top ends of the air gaps AG may or may not extend higher than top ends of the conductive pillars 116. In some embodiments, the air gaps AG may not expose sidewalls of the conductive pillars 116 or first top ends 403*b*-1 of the low-level conductive patterns 403*b*. In alternative embodiments, some portions of the conductive pillars 116 and/or some portions of the low-level conductive patterns 403*b* may be exposed by the air gaps AG.

Figure 19E:
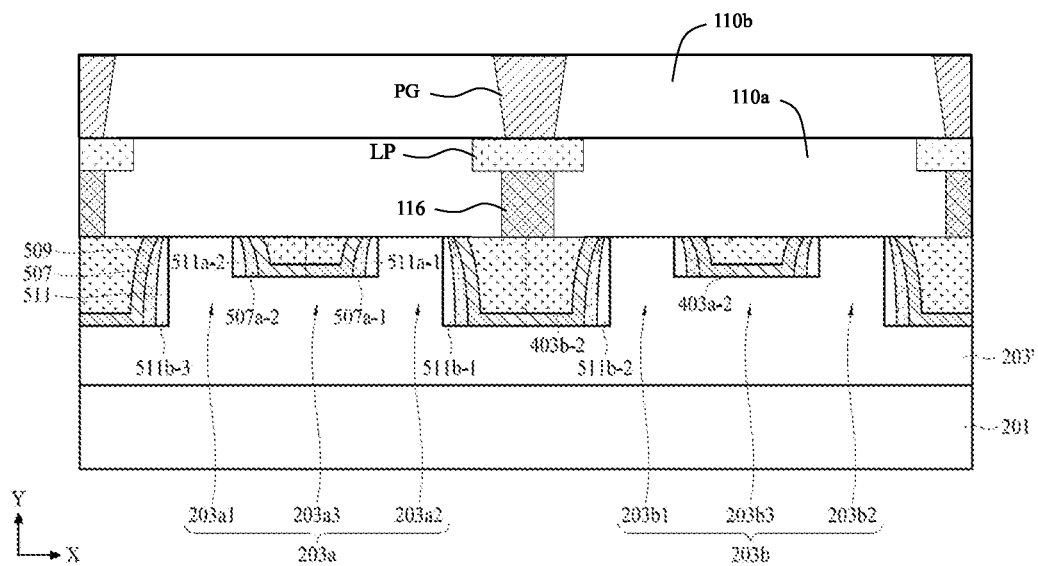

Referring to FIGS. 18 and 19E, step S49 is performed, and capacitor plugs PG and a second dielectric layer 110*b* are formed over the landing pads LP and the first dielectric layer 110*a*. The second dielectric layer 110*b* is located on the first dielectric layer 110*a* and the landing pads LP, and the capacitor plugs PG penetrate through the second dielectric layer 110*b* to establish electrical connection with the landing pads LP. A footprint area of the landing pad LP is greater than a footprint area of the capacitor plug PG. In some embodiments, a dielectric material layer may be globally formed on the dielectric layer 110*a* and the landing pads LP by a deposition process (e.g., a CVD process), and through holes are subsequently formed in the dielectric material layer by a lithography process and an etching process (e.g., an anisotropic etching process), to form the second dielectric layer 110*b*. Next, a conductive material is deposited in the through holes by a deposition process (e.g., a PVD process), a plating process or a combination thereof, and a planarization process may be performed to remove portions of the conductive material over the second dielectric layer 110*b*. Remaining portions of the conductive material form the capacitor plugs PG.

Figure 19F:
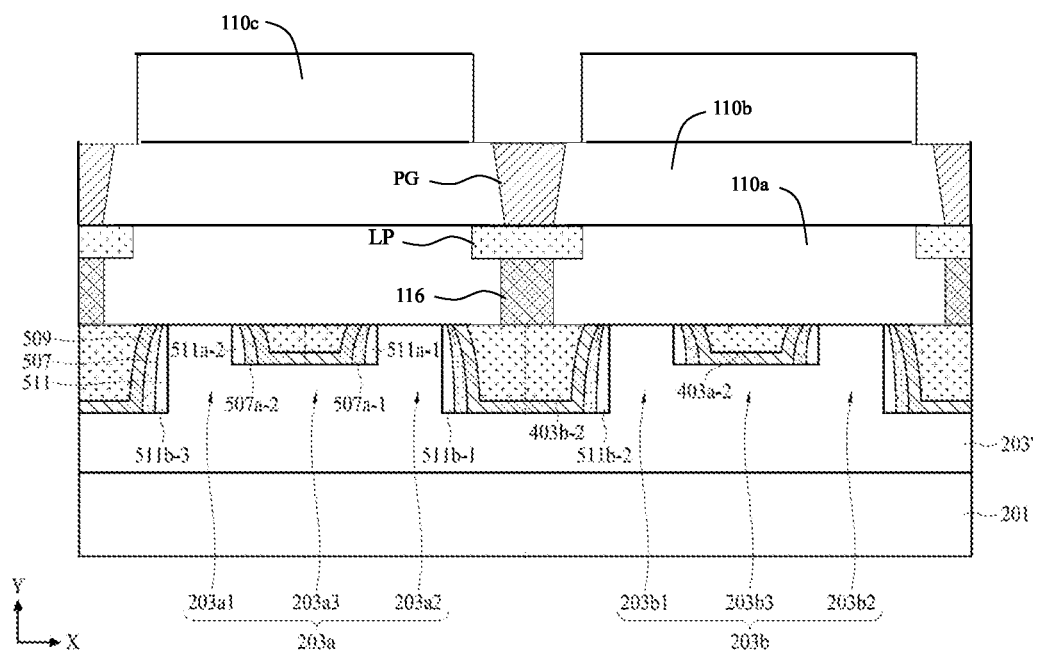

Referring to FIGS. 18 and 19F, step S51 is performed, and a third dielectric layer 110*c* is formed on the capacitor plugs PG and the second dielectric layer 110*b*. The third dielectric layer 110*c* is located on the second dielectric layer 110*b*, and has openings overlapping the capacitor plugs PG. In some embodiments, the openings further overlap portions of the second dielectric layer 110*b* surrounding the capacitor plugs PG. In some embodiments, a dielectric material layer may be globally formed on the second dielectric layer 110*b* and the capacitor plugs PG by a deposition process (e.g., a CVD process), and openings (as shown in FIG. 19F) are subsequently formed in the dielectric material layer by a lithography process and an etching process (e.g., an anisotropic etching process), to form the third dielectric layer 110*c*.

Figure 19G:
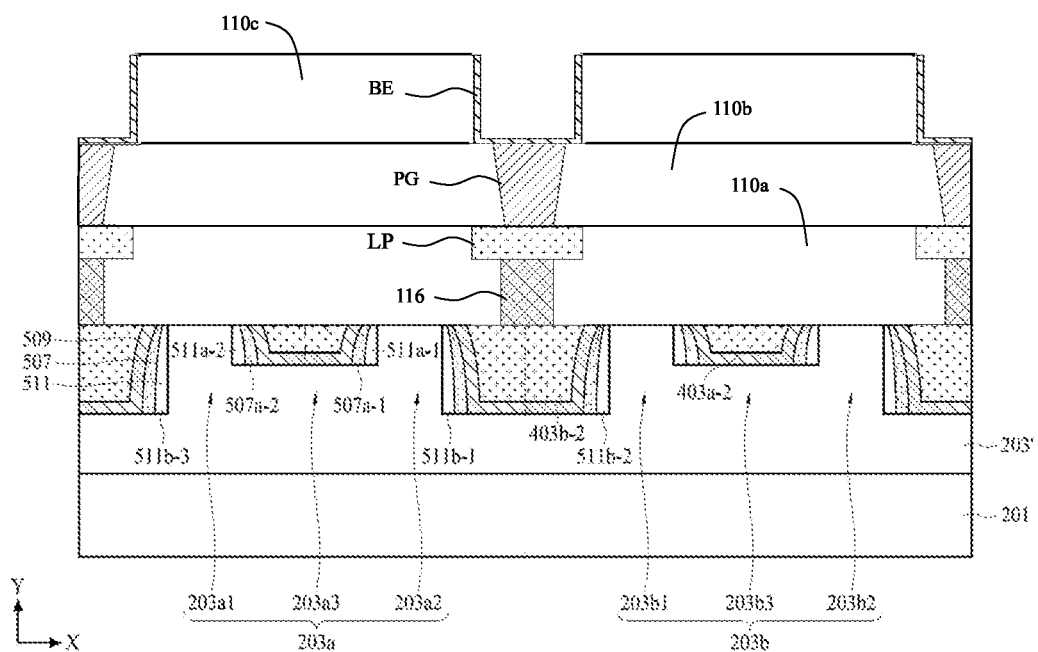
Figure 19H:
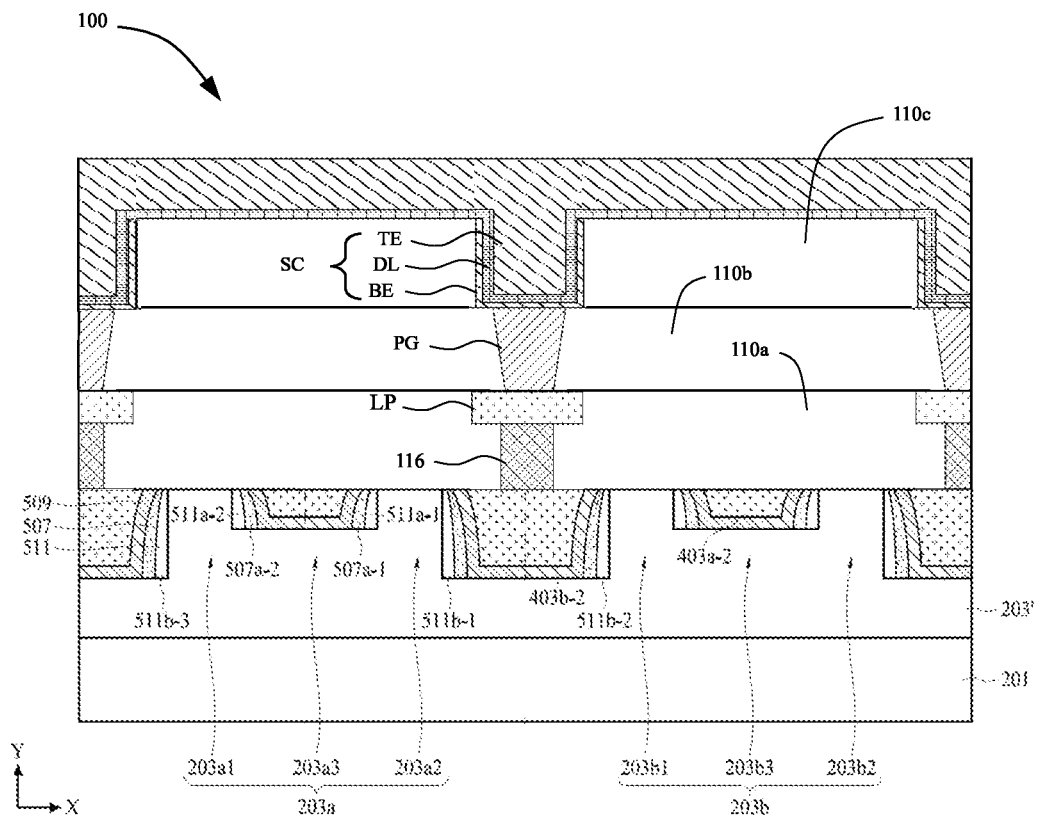

Referring to FIGS. 18 and 19G, step S53 is performed, and bottom electrodes BE are formed on the exposed capacitor plugs PG. The bottom electrodes BE are conformally formed in the openings of the third dielectric layer 110*c*, and are separated from one another. Accordingly, the bottom electrodes BE cover the capacitor plugs PG, and establish electrical connection with the capacitor plugs PG. In embodiments where the openings of the third dielectric layer 110*c* further overlap portions of the second dielectric layer 110*b* surrounding the capacitor plugs PG, such portions of the second dielectric layer 110*b* are covered by the bottom electrodes BE as well. In some embodiments, a conductive material layer is conformally formed to cover surfaces of the third dielectric layer 110*c* as well as exposed surfaces of the capacitor plugs PG and the second dielectric layer 110*b*. Thereafter, a planarization process is performed to remove portions of the conductive material layer over the third dielectric layer 110*c*. Remaining portions of the conductive material layer form the bottom electrodes BE.

Referring to FIGS. 18 and 19H, step S55 is performed, and a fourth dielectric layer DL and a top electrode TE are sequentially formed on the third dielectric layer 110*c* and the bottom electrode BE. The fourth dielectric layer DL conformally covers exposed surfaces of the third dielectric layer 110*c* and the bottom electrodes BE. The top electrode TE fills the openings of the third dielectric layer 110*c*, and covers a top surface of the fourth dielectric layer DL. In some embodiments, the fourth dielectric layer DL and the top electrode TE are globally formed. In such embodiments, the storage capacitors SC share a same fourth dielectric layer DL and a same top electrode TE, but include separate bottom electrodes BE. A method for forming the fourth dielectric layer DL may include a deposition process (e.g., a CVD process), while a method for forming the top electrode TE may include a deposition process (e.g., a PVD process), a plating process or a combination thereof.

Thus, the semiconductor device structure 100 (e.g., the memory device) is completely formed by a manufacturing method according to some embodiments of the present disclosure.

FIGS. 21 to 23 and FIG. 2 are cross-sectional views illustrating sequential intermediate stages in the formation of the semiconductor device structure 200*b*. The semiconductor device structure 200*b* is similar to, or same as, the semiconductor device structure 200*a*, except that the hard mask structures 205*a*1, 205*a*2, 205*b*1 and 205*b*2 are not formed between the spacer elements 223*a*', 223*b*', 223*c*', 223*d*' and the first and second target structures 203*a*, 203*b*.

Figure 21:
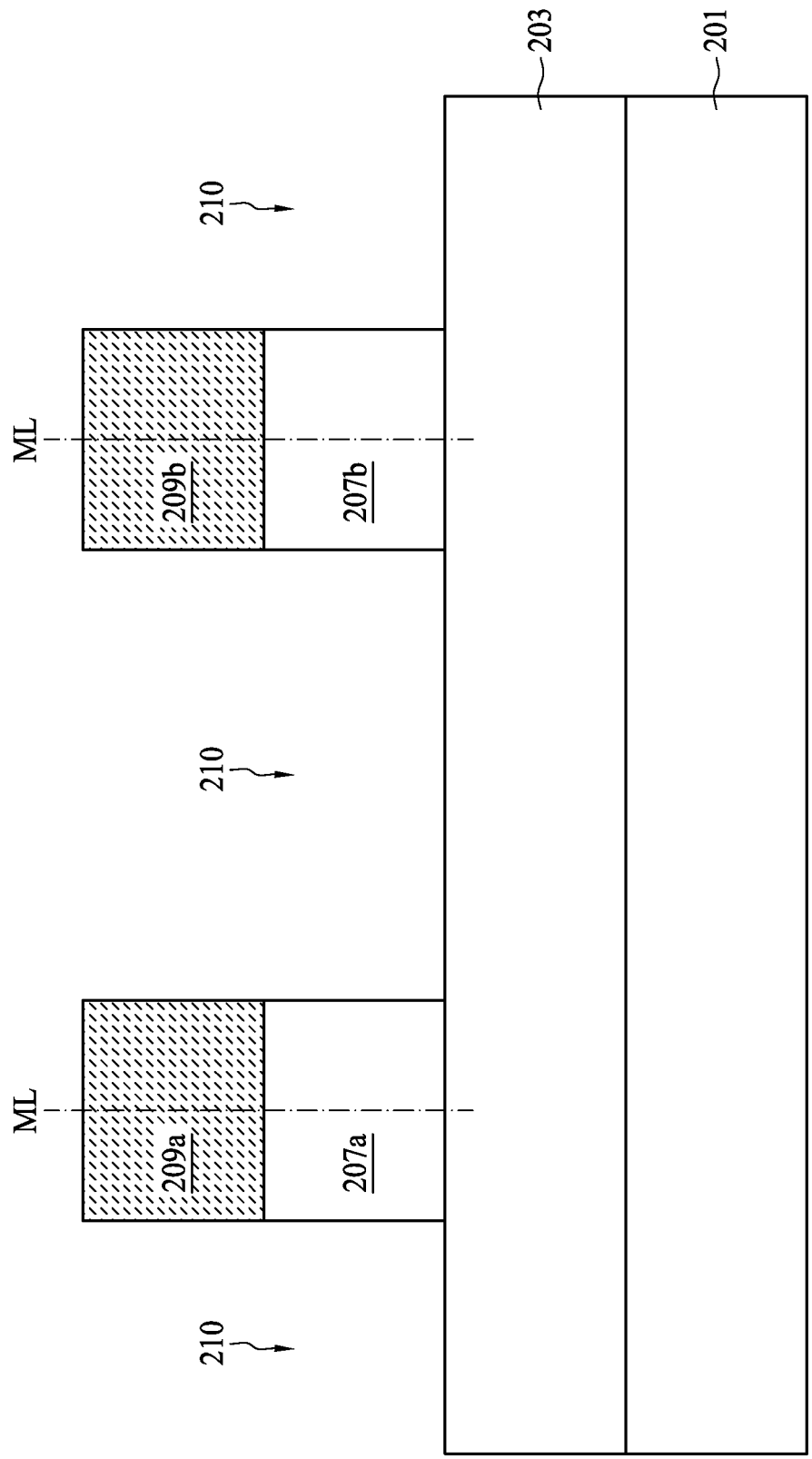
FIG. 21 is a cross-sectional view illustrating an intermediate stage in formation of hard mask pillars and photoresist patterns over a substrate, in accordance with some embodiments.

As shown in FIG. 21, the target material 203 is disposed over the semiconductor substrate 201, and the hard mask pillars 207*a* and 207*b* are disposed over the target material 203 by an etching process using the photoresist patterns 209*a* and 209*b* as a mask, in accordance with some embodiments. The respective step is illustrated as the steps S21, S23 and S25 in the method 20 shown in FIG. 4. In some embodiments, in contrast to the structure shown in FIG. 6, the target material 203 of FIG. 21 is not covered by the hard mask layer 205. More specifically, the hard mask layer 205 is not formed in the structure of FIG. 21, and the target material 203 is exposed by the openings 210, in accordance with some embodiments.

Figure 22:
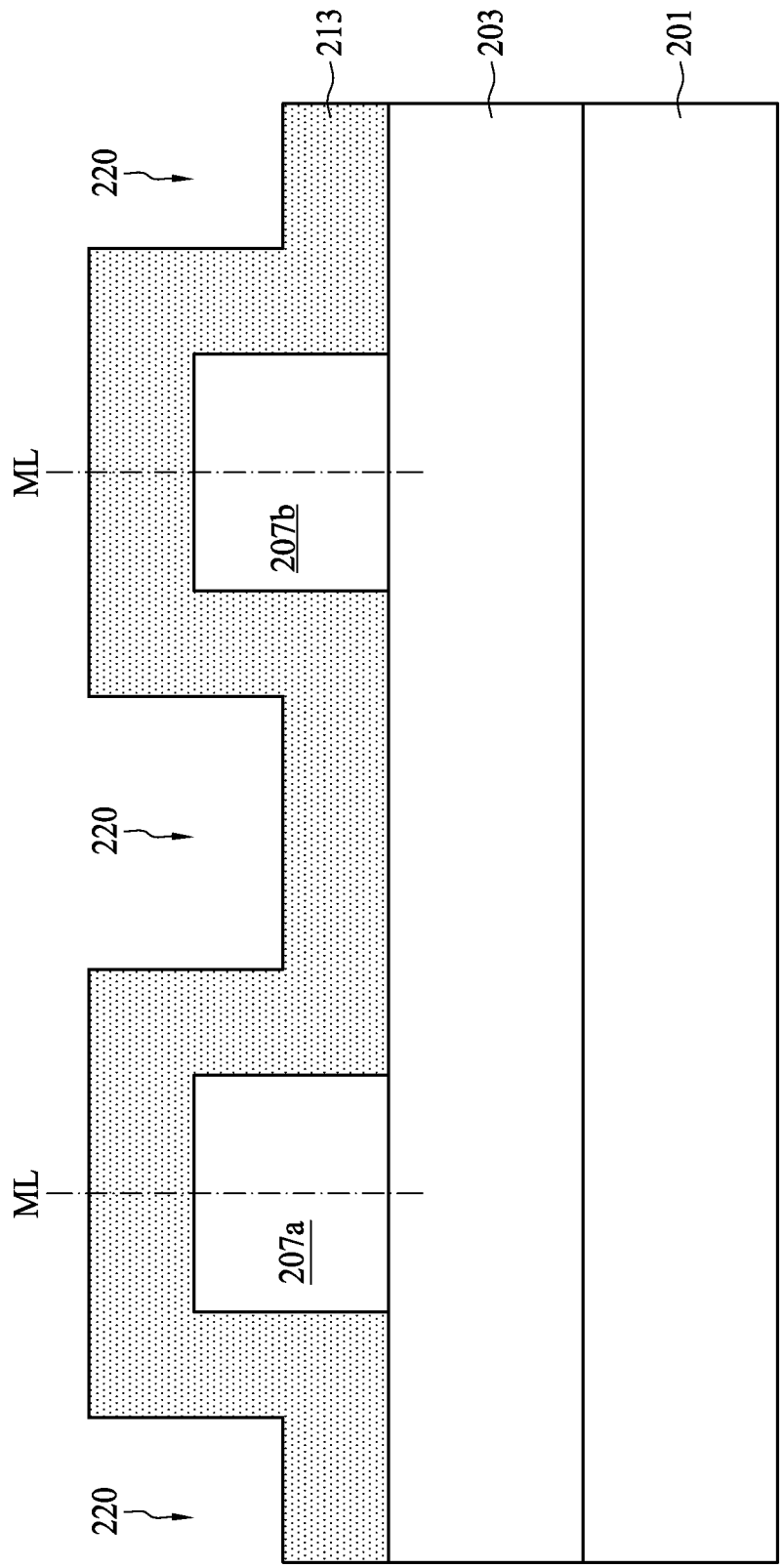
FIG. 22 is a cross-sectional view illustrating an intermediate stage in formation of a conformal spacer material over the substrate, in accordance with some embodiments.

Next, the photoresist patterns 209*a* and 209*b* are removed, and the spacer material 213 is conformally deposited over the top surfaces and the sidewall surfaces of the hard mask pillars 207*a*, 207*b* and the top surface of the target material 203, such that reduced openings 220 are obtained, as shown in FIG. 22 in accordance with some embodiments.

Figure 23:
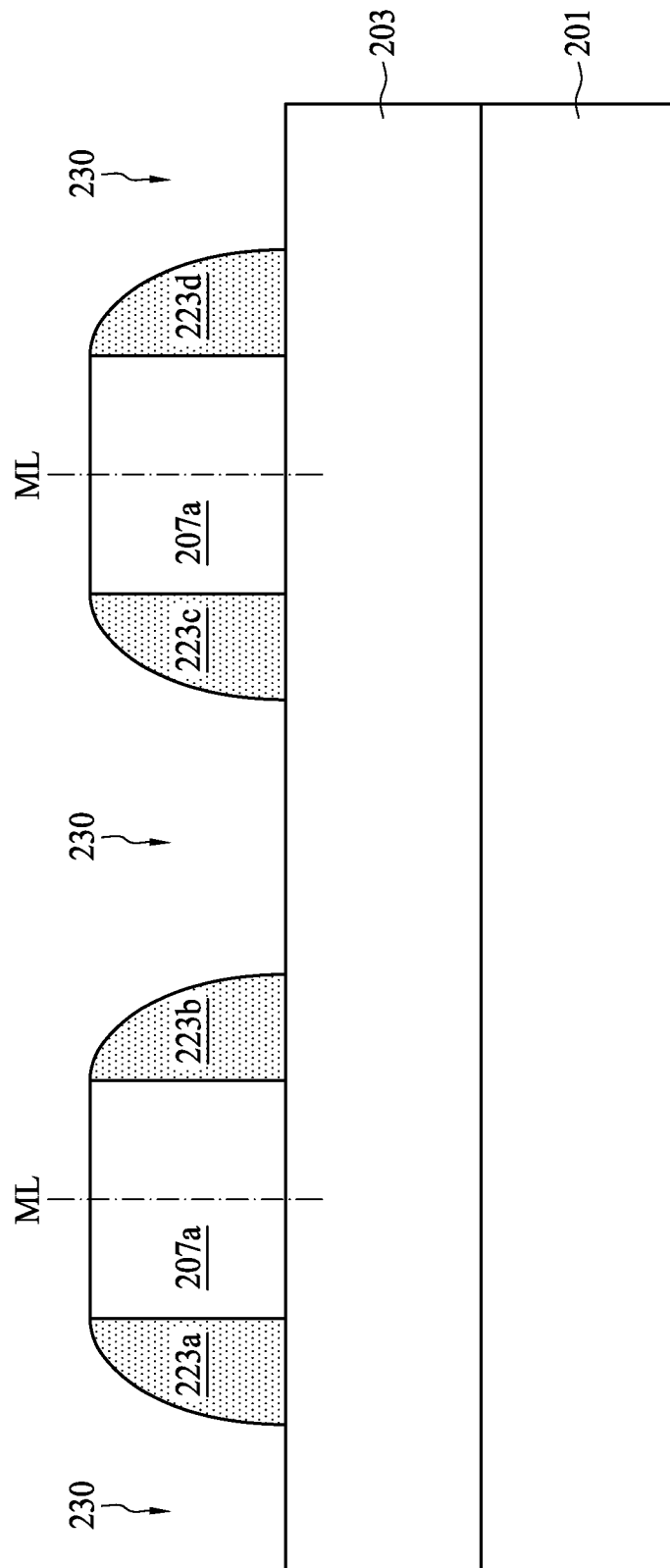
FIG. 23 is a cross-sectional view illustrating an intermediate stage in formation of a spacer element over the substrate, in accordance with some embodiments.

Next, the spacer material 213 is etched to form spacers 223*a*, 223*b*, 223*c* and 223*d* over the sidewall surfaces of the hard mask pillars 207*a*, 207*b*, as shown in FIG. 23 in accordance with some embodiments. The respective steps are illustrated as the step S27 in the method 20 shown in FIG. 4. In some embodiments, in contrast to the structure shown in FIG. 5, the spacers 223a, 223b, 223c and 223d of FIG. 20 are in direct contact with the target material 203.

Next, the hard mask pillars 207a, 207b and the target material 203 are etched using the spacers 223a, 223b, 223c and 223d as a mask, and the spacers 223a, 223b, 223c and 223d are slightly etched to form spacer elements 223a', 223b', 223c' and 223d', as shown in FIG. 2 in accordance with some embodiments. The respective steps are illustrated as the step S28 in the method 20 shown in FIG. 4.

In some embodiments, the hard mask pillars 207a, 207b are entirely removed, and the target layer 203' and first and second target structures 203a, 203b are formed over the substrate 201 by the etching of the target material 203, in accordance with some embodiments. As mentioned above, in contrast to the semiconductor device structure 200a, the spacer elements 223a', 223b', 223c' and 223d' of the semiconductor device structure 200b are in direct contact with the target structures 203a and 203b, in accordance with some embodiments. In some embodiments, the fabrication processes shown in FIGS. 10 to 17 may be performed after FIG. 22 to form the high-level conductive pattern 403a and the low-level conductive pattern 403b as shown in FIG. 17.

Figure 5:
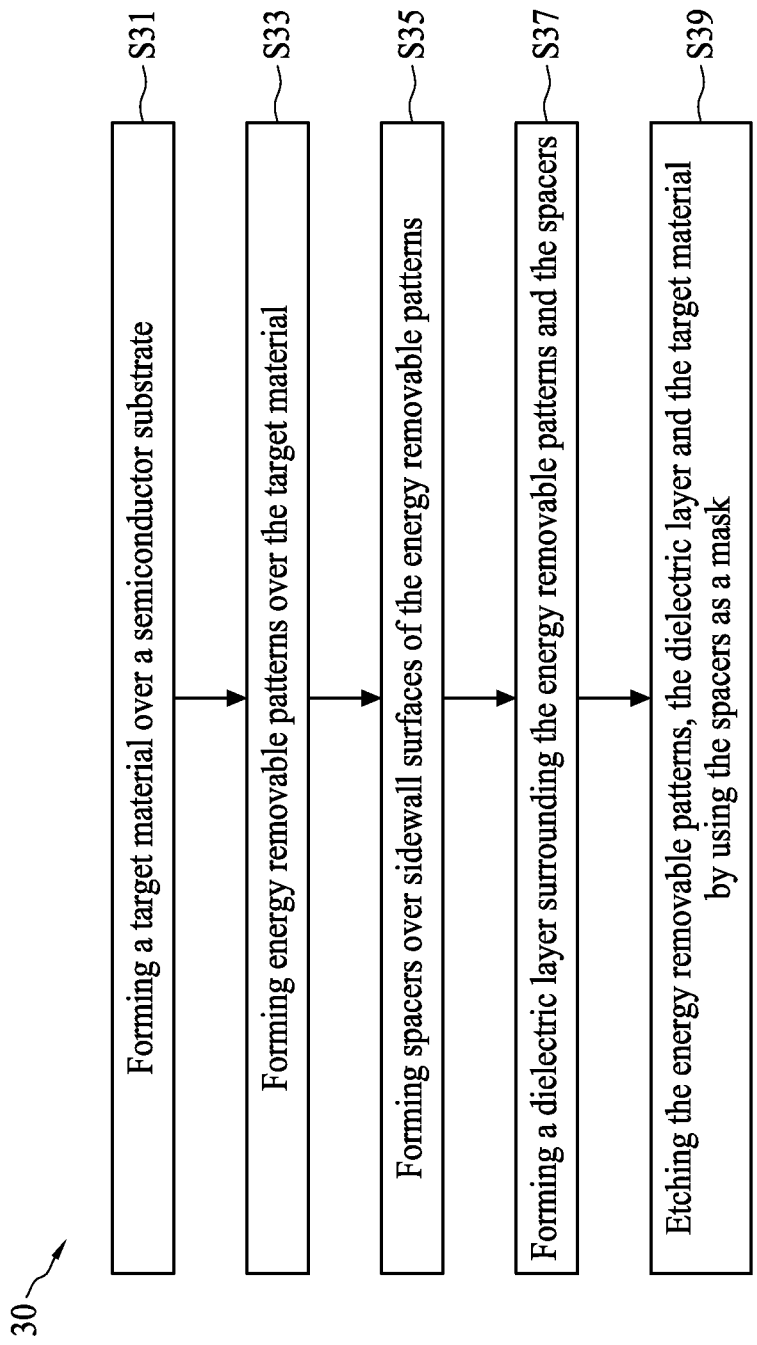
FIG. 5 is a flow diagram illustrating a method of forming an intermediate semiconductor device structure, in accordance with some embodiments.

FIG. 5 is a flow diagram illustrating a method 30 of forming the semiconductor device structure 300, wherein the method 30 includes steps S31, S33, S35, S37 and S39, in accordance with some embodiments. The steps S31 to S39 of FIG. 5 are elaborated in connection with FIGS. 24 to 28, which are cross-sectional views illustrating sequential intermediate stages in the formation of the intermediate semiconductor device structure 300, in accordance with some embodiments.

Figure 24:
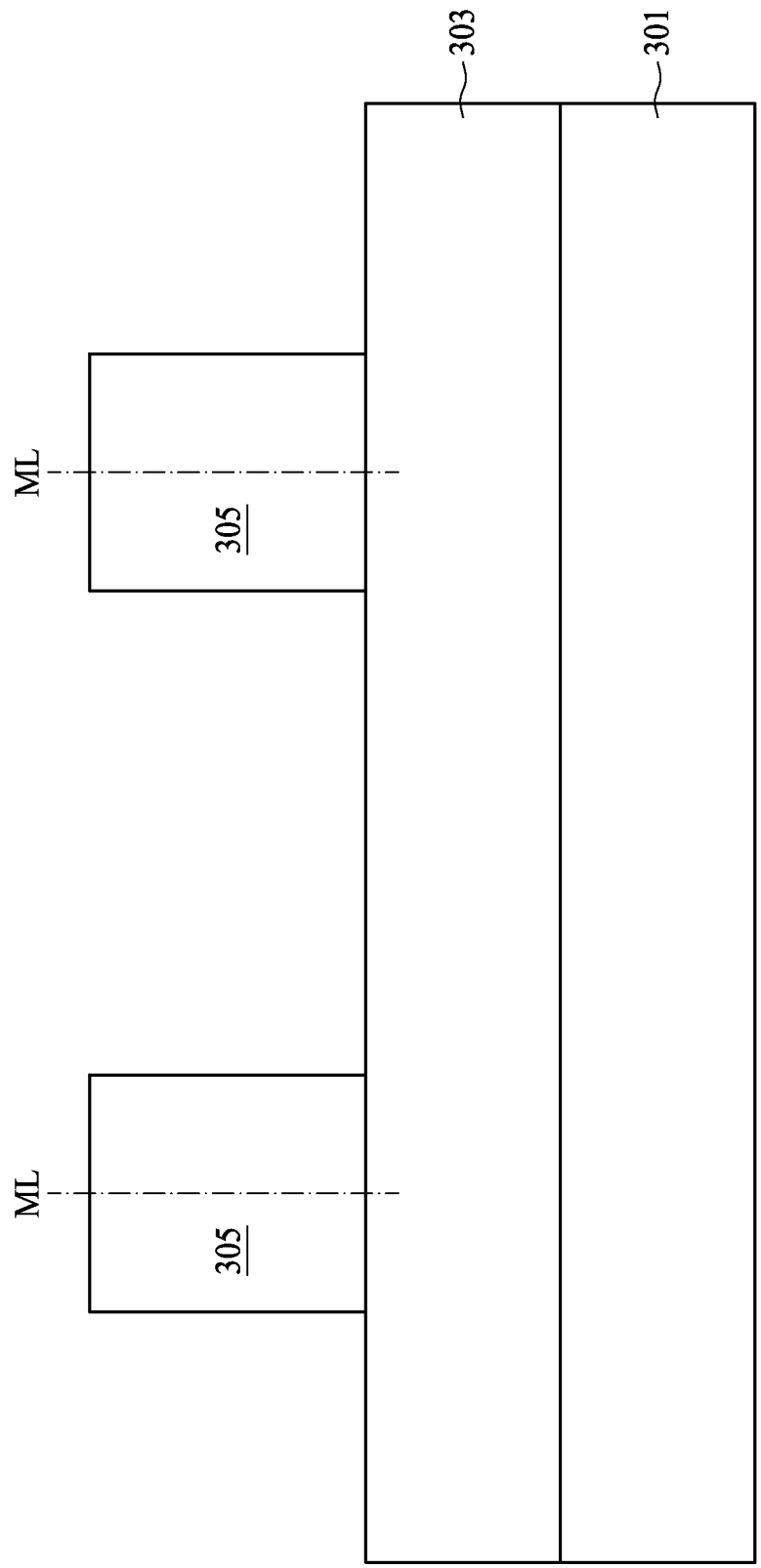
FIG. 24 is a cross-sectional view illustrating an intermediate stage in formation of an energy-removable pattern over a substrate, in accordance with some embodiments.

As shown in FIG. 24, a semiconductor substrate 301 is provided, and a target material 303 is disposed over the semiconductor substrate 301. Details of the semiconductor substrate 301 and the target material 303 may be similar to or same as those of the semiconductor substrate 201 and the target material 203, and descriptions thereof are not repeated herein. The respective step is illustrated as the step S31 in the method 30 shown in FIG. 5.

Still referring to FIG. 24, energy removable patterns 305 are disposed over the target material 303, in accordance with some embodiments. The respective step is illustrated as the step S33 in the method 30 shown in FIG. 5. In some embodiments, the energy removable patterns 305 include a thermal decomposable material. In some other embodiments, the energy removable patterns 305 include a photonic decomposable material, an e-beam decomposable material, or another applicable energy decomposable material. Specifically, in some embodiments, the energy removable patterns 305 include a base material and a decomposable porogen material that is substantially removed upon exposure to an energy source (e.g., heat).

In some embodiments, the base material includes hydrogen silsesquioxane (HSQ), methylsilsesquioxane (MSQ), porous polyarylether (PAE), porous SiLK, or porous silicon oxide ($SiO_2$), and the decomposable porogen material includes a porogen organic compound, which can, in subsequent processes, provide porosity to a space originally occupied by the energy removable patterns 305.

In some embodiments, the energy removable patterns 305 are formed by a deposition process and a patterning process. The deposition process may be CVD, PVD, ALD, spin coating, or another suitable process, and the patterning process for forming the energy removable patterns 305 may include a photolithography process and an etching process. The photolithography process may include photoresist coating (e.g., spin coating), soft baking, mask aligning, exposure, post-exposure baking, developing the photoresist, rinsing and drying (e.g., hard baking). The etching process may include a dry etching process or a wet etching process.

In some embodiments, the target material 303 includes a thermal decomposable material, a photonic decomposable material, an e-beam decomposable material, or another applicable energy decomposable material. It should be noted that the target material 203 and the energy removable patterns 305 include a same material, or a similar material, in accordance with some embodiments.

Figure 25:
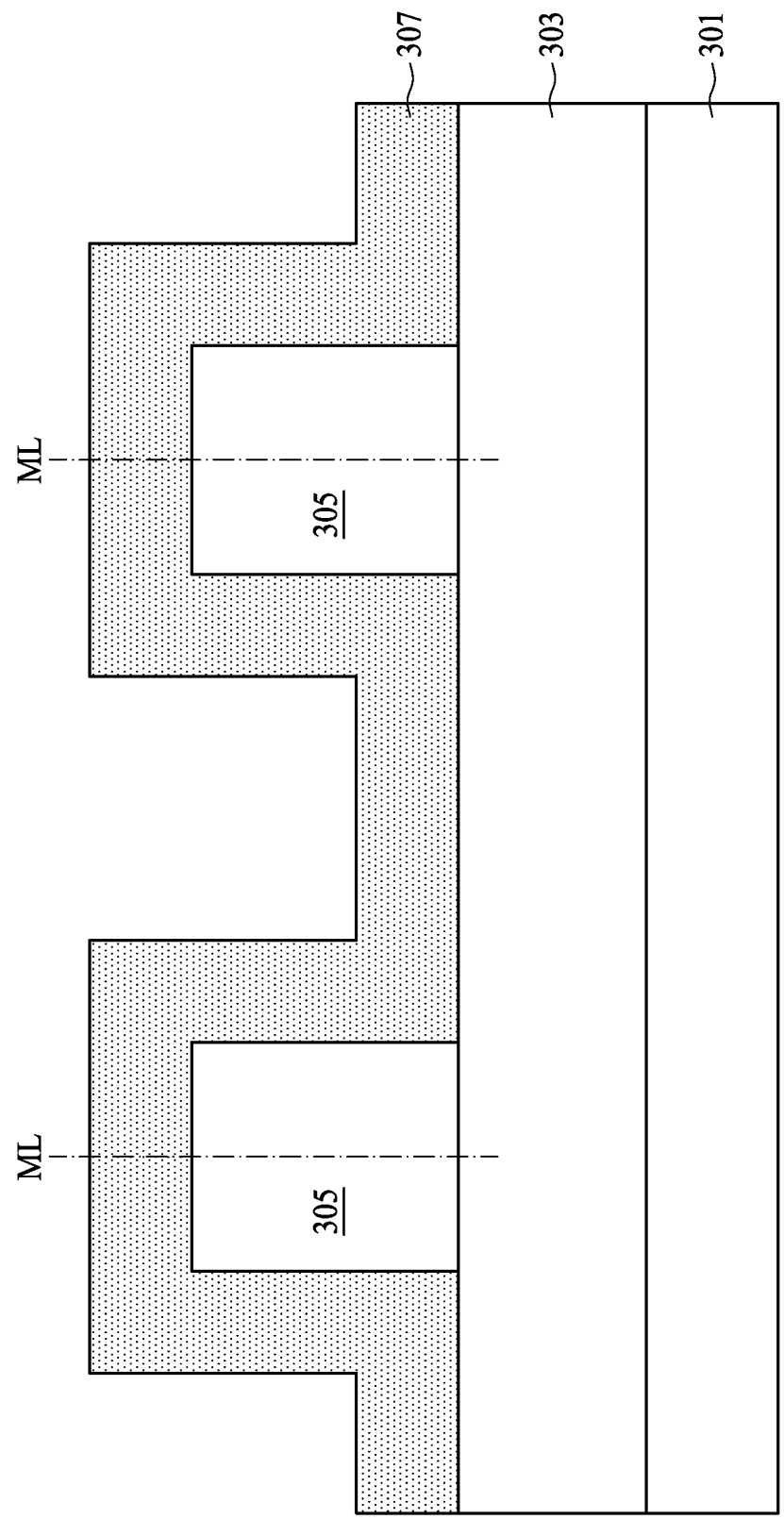
FIG. 25 is a cross-sectional view illustrating an intermediate stage in formation of a conformal spacer material over the energy-removable pattern, in accordance with some embodiments.

After the energy removable patterns 305 are formed, a spacer material 307 is conformally deposited over the top surfaces and the sidewall surfaces of the energy removable patterns 305 and the top surface of the target material 303, as shown in FIG. 25 in accordance with some embodiments.

In some embodiments, the spacer material 307 comprises silicon oxide, silicon carbide, silicon nitride, silicon oxynitride, another suitable material, or a combination thereof, and the deposition process for forming the spacer material 307 includes CVD, PVD, ALD, spin coating, or another suitable process. In some embodiments, the material of the spacer material 307 is different from the material of the energy removable patterns 305. It should be noted that the material of the energy removable patterns 305 has a high etching selectivity against the material of the spacer material 307.

Figure 26:
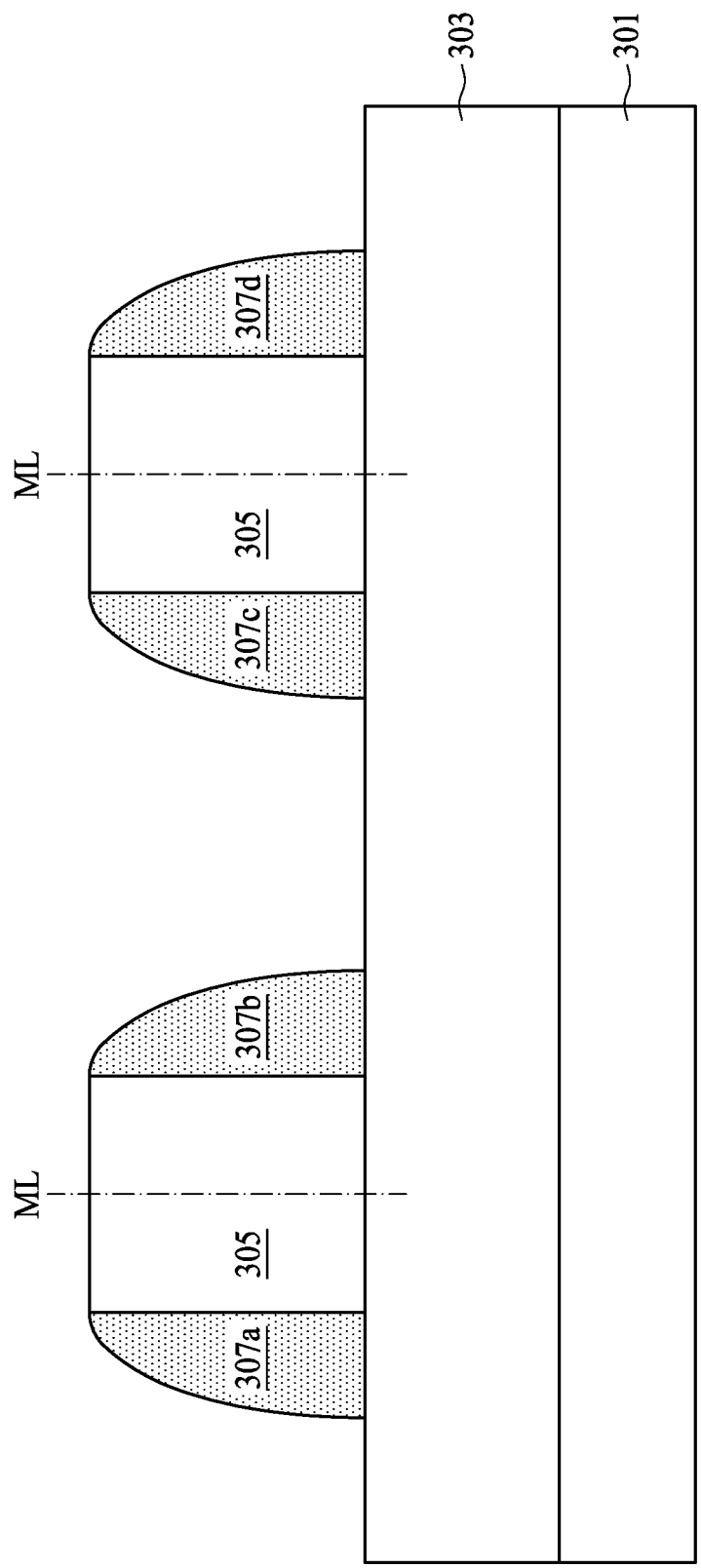
FIG. 26 is a cross-sectional view illustrating an intermediate stage in formation of a spacer element over the substrate, in accordance with some embodiments.

Next, the spacer material 307 is etched to form spacers 307a, 307b, 307c and 307d over sidewall surfaces of the energy removable patterns 305, as shown in FIG. 26 in accordance with some embodiments. The respective steps are illustrated as the step S35 in the method 30 shown in FIG. 5. In some embodiments, the etching process is an anisotropic etching process, which removes a same amount of the spacer material 307 vertically in all places, leaving the spacers 307a, 307b, 307c and 307d over the sidewall surfaces of the energy removable patterns 305. In some embodiments, the etching process is a dry etching process.

Figure 27:
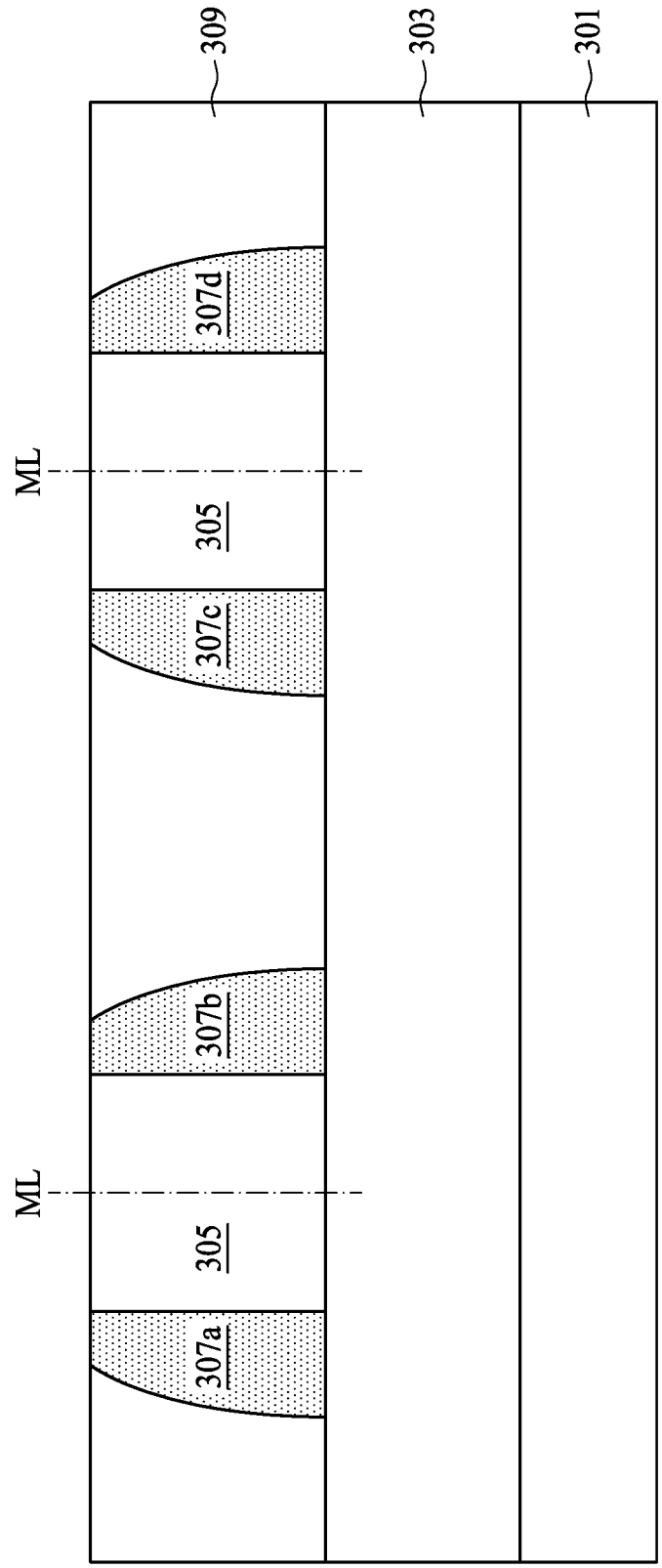
FIG. 27 is a cross-sectional view illustrating an intermediate stage in formation of a dielectric layer surrounding the energy-removable pattern and spacers over an intermediate semiconductor device structure, in accordance with some embodiments.

After the spacers 307a, 307b, 307c and 307d are formed, a dielectric layer 309 is formed surrounding the energy removable patterns 305 and the spacers 307a, 307b, 307c and 307d, as shown in FIG. 27 in accordance with some embodiments. The respective steps are illustrated as the step S37 in the method 30 shown in FIG. 5.

In some embodiments, the dielectric layer 309 includes silicon oxide, silicon carbide, silicon nitride, silicon oxynitride, one or more suitable dielectric materials, or a combination thereof. In some embodiments, the material of the dielectric layer 309 is different from the material of the spacers 307a, 307b, 307c and 307d. It should be noted that the material of the dielectric layer 309 has a high etching selectivity against the material of the spacers 307a, 307b, 307c and 307d.

In some embodiments, the dielectric layer 309 includes a thermal decomposable material, a photonic decomposable material, an e-beam decomposable material, or another applicable energy decomposable material. It should be noted that the dielectric layer 309 and the energy removable patterns 305 include a same material, or a similar material, in accordance with some embodiments.

In some embodiments, the dielectric layer 309 is formed by a deposition process and a subsequent planarization process. The deposition process may be CVD, PVD, ALD, spin coating, or another applicable process, and the planarization process may be a chemical mechanical polishing (CMP) process.

Figure 28:
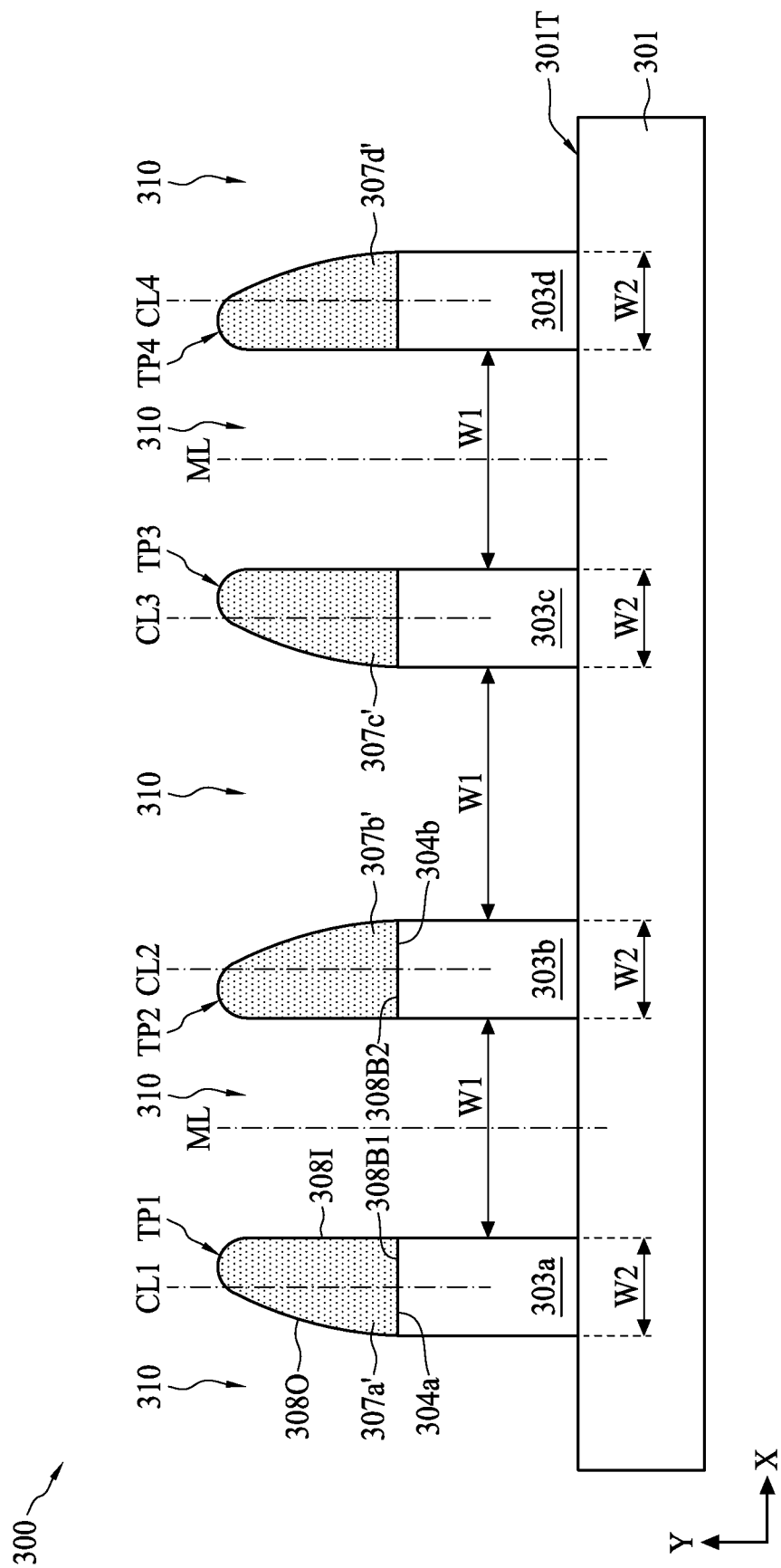
FIG. 28 is a cross-sectional view illustrating formation of an intermediate semiconductor device structure after etching of the energy-removable pattern, the dielectric layer and the target material using the spacers as an etching mask, in accordance with some embodiments.

Next, the energy removable patterns 305, the dielectric layer 309 and the target material 303 are etched, using the spacer elements 307a, 307b, 307c and 307d as an etching mask, as shown in FIG. 28 in accordance with some embodiments. The respective steps are illustrated as the step S39 in the method 30 shown in FIG. 5. In some embodiments, the etching process is a dry-etching process. In some embodiments, referring to FIG. 28, the spacer element 307a' and the spacer element 307b' are substantially symmetric with respect to a middle line ML between the spacer element 307a' and the spacer element 307b', and the spacer element 307c' and the spacer element 307d' are substantially symmetric with respect to a middle line ML between the spacer element 307c' and the spacer element 307d'.

In some embodiments, referring to FIG. 28, the spacer elements 307a', 307b', 307c' and 307d' have rounded top surfaces at the topmost points TP1, TP2, TP3 and TP4, respectively, in the cross-sectional view in FIG. 28. In some embodiments, referring to FIG. 28, the spacer element 307a' has an inner surface 308I and an outer surface 308O, the inner surface 308I faces the middle line ML in the cross-sectional view, the outer surface 308O faces away from the middle line ML, the inner surface 308I is substantially a non-curved surface, the outer surface 308O is substantially a curved surface, and a curvature of the inner surface 308I is smaller than that of the outer surface 308O. In some embodiments, the spacer elements 307b', 307c' and 307d' have similar configurations.

In some embodiments, referring to FIG. 28, the first target structure 303a has a top surface 304a with a first top width, the spacer element 307a' has a bottom surface 308B1 with a first bottom width, the top surface 304a contacts the bottom surface 308B1, and the first top width is substantially equal to the first bottom width. In some embodiments, referring to FIG. 28, a second target structure 303b has a top surface 304b with a second top width, the spacer element 307b' has a bottom surface 308B2 with a second bottom width, the top surface 304b contacts the bottom surface 308B2, and the second top width is substantially equal to the second bottom width. In some embodiments, the target structures 303c and 303d have configurations similar to those of the target structures 303a and 303b.

In some embodiments, referring to FIG. 28, the openings 310 have a same width W1, and the target structures 303a, 303b, 303c and 303d have a same width W2. In some embodiments, the width W1 is designed to be same as the width W2, i.e., equal spaces and patterns. In some embodiments, the semiconductor device structure 300 includes a film structure (not shown in the drawings) over the semiconductor substrate 301. In some embodiments, the target structures 303a, 303b, 303c and 303d are formed over the film structure, and serve as fine patterns, which can be used as a hard mask in subsequent fabrication processes for patterning corresponding fine patterns in the film structure. In some embodiments, the fabrication processes shown in FIGS. 10 to 17 may be performed after the operations of FIG. 23 to form the high-level conductive pattern 403a and the low-level conductive pattern 403b as shown in FIG. 17.

In some embodiments, the energy removable patterns 305 are entirely removed, and the target structures 303a, 303b, 303c and 303d are formed by etching the target material 303, in accordance with some embodiments. In addition, the spacers 307a, 307b, 307c and 307d are slightly etched to form the spacer elements 307a', 307b', 307c' and 307d'. It should be noted that the material of the energy-removable patterns 305 has a high etching selectivity against the material of the spacers 307a, 307b, 307c and 307d (i.e., the material of the spacer elements 307a', 307b', 307c' and 307d') during the etching process.

The material of the energy removable patterns 305 has a first etching selectivity against the material of the spacers 307a, 307b, 307c, 307d, the material of the dielectric layer 309 has a second etching selectivity against the material of the spacers 307a, 307b, 307c, 307d, and the material of the target material 303 has a third etching selectivity against the material of the spacers 307a, 307b, 307c, 307d. In some embodiments, the first etching selectivity, the second etching selectivity and the third etching selectivity are similar to each other.

Since the energy removable patterns 305, the dielectric layer 309 and the target material 303 have a high etching selectivity against the spacers 307a, 307b, 307c, 307d in the etching process for forming the spacer elements 307a', 307b', 307c', 307d', the etching process may be performed all the way down to a top surface 301T of the semiconductor substrate 301 while avoiding the collapse of the spacer elements 307a', 307b', 307c' and 307d'.

In one embodiment of the present disclosure, a semiconductor device structure is provided. The semiconductor device structure includes a substrate; a first target structure disposed over the substrate, wherein the first target structure comprises a first portion, a second portion, and a third portion connected to the first portion and the second portion, wherein a height of the first portion and a height of the second portion are greater than a height of the third portion; a second target structure disposed over the substrate, wherein the second target structure comprises a fourth portion, a fifth portion, and a sixth portion connected to the fourth portion and the fifth portion; a first low-level conductive pattern and a second low-level conductive pattern, both positioned between the first target structure and the second target structure; a first high-level conductive pattern and a second high-level conductive pattern, both positioned in the first target structure; a first conductive pillar and a second conductive pillar, disposed over the substrate, wherein the first conductive pillar overlaps and is electrically connected to the first low-level conductive pattern and the second conductive pillar overlaps and is electrically connected to the second low-level conductive pattern; a first landing pad and a second landing pad, disposed on the first and second conductive pillars, respectively, wherein the first landing pad overlaps and is electrically connected to the first conductive pillar and the second landing pad overlaps and is electrically connected to the second conductive pillar, wherein sidewalls of the first and second conductive pillars are recessed from sidewalls of the first and second landing pads, wherein the first and second landing pads are made of a conductive material different from a conductive material used to form the first and second conductive pillars, and wherein a resistivity of the first and second landing pads is less than a resistivity of the first and second conductive pillars; and a dielectric layer, laterally surrounding the first and second conductive pillars and the first and second landing pads, and having an air gap between the first and second conductive pillars.

In another embodiment of the present disclosure, a semiconductor device structure is provided. The semiconductor device structure includes a substrate; a first target structure disposed over the substrate, wherein the first target structure comprises a first portion, a second portion, and a third portion connected to the first portion and the second portion, wherein a height of the first portion and a height of the second portion are greater than a height of the third portion; a second target structure disposed over the substrate, wherein the second target structure comprises a fourth portion, a fifth portion, and a sixth portion connected to the fourth portion and the fifth portion; a low-level conductive pattern, positioned between the first target structure and the second target structure, wherein the low-level conductive pattern has a first top end and a first bottom end; a high-level conductive pattern, positioned in the first target structure, wherein the high-level conductive pattern has a second top end and a second bottom end, wherein the first bottom end is lower than the second bottom end, and the first top end and the second top end are substantially at a same level; a conductive pillar, disposed over the substrate, wherein the conductive pillar overlaps and is electrically connected to the low-level conductive pattern; a landing pad, disposed on the conductive pillar, wherein the landing pad overlaps and is electrically connected to the conductive pillar, sidewalls of the conductive pillar are recessed from sidewalls of the landing pad, the landing pad and the conductive pillar are made of different conductive materials, and a resistivity of the landing pad is less than a resistivity of the conductive pillar; and a storage capacitor, disposed over and electrically connected to the landing pad.

In yet another embodiment of the present disclosure, a method for preparing a semiconductor device structure is provided. The method includes forming a hard mask material over a substrate; etching the hard mask material to form hard mask pillars; forming spacers over sidewall surfaces of the hard mask pillars; etching the hard mask pillars and a target material using the spacers as a mask to integrally form a plurality of target structures, a high-level recess in one of the plurality of target structures, and a low-level recess between an adjacent pair of the target structures; integrally forming a high-level conductive pattern in the high-level recess and a low-level conductive pattern in the low-level recess; globally forming a conductive pillar and a landing pad above the low-level conductive pattern; forming a capacitor plug on the landing pad; and forming a storage capacitor on the capacitor plug.

Embodiments of an intermediate semiconductor device structure and methods for forming the same are provided. The method for forming the semiconductor device structure may include undercutting a photoresist pattern over a semiconductor substrate, and forming an inner spacer element over a sidewall surface of the photoresist pattern. The inner spacer element has a portion extending into a recess (i.e., the undercut region) of the photoresist pattern to form a footing, wherein a width of the portion of the inner spacer element increases continuously as the portion extends toward the semiconductor substrate. As a result, the inner spacer element may be prevented from collapsing after removal of the photoresist pattern.

The semiconductor device structure described above (e.g., a memory device) according to embodiments of the present disclosure includes memory cells arranged in an array. Each memory cell includes a transistor and a storage capacitor connected to the transistor. A conductive pillar and a landing pad are disposed between one of the storage capacitors and an active region (e.g., a low-level conductive pattern) of the transistor connected to such storage capacitor. The landing pad is disposed on the conductive pillar, and a sidewall of the conductive pillar is recessed from a sidewall of the landing pad. Therefore, a space between the landing pads of adjacent memory cells is smaller than a space between the conductive pillars of adjacent memory cells. As a result, while depositing a dielectric material between stacked structures comprising one of the conductive pillars and an overlying landing pad, the space between adjacent landing pads may be sealed before the space between adjacent conductive pillars is filled. Consequently, air gaps may be formed between the conductive pillars. Due to a low dielectric constant of air sealed in the air gaps, a parasitic capacitance between the conductive pillars can be reduced by the formation of the air gaps; thus, an RC delay of the memory device can be effectively reduced. As a result, an operating speed of the memory device can be improved. In those embodiments where a resistivity of the landing pads is less than a resistivity of the conductive pillars, a parasitic capacitance between the landing pads may be limited, even though the space between the adjacent landing pads is narrower than the space between the adjacent conductive pillars.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device structure, comprising:
    a substrate;
    a first target structure disposed over the substrate, wherein the first target structure comprises a first portion, a second portion, and a third portion connected to the first portion and the second portion, a height of the first portion and a height of the second portion are greater than a height of the third portion;
    a second target structure disposed over the substrate, wherein the second target structure comprises a fourth portion, a fifth portion, and a sixth portion connected to the fourth portion and the fifth portion;
    a low-level conductive pattern, positioned between the first target structure and the second target structure, wherein the low-level conductive pattern has a first top end and a first bottom end;
    a high-level conductive pattern, positioned in the first target structure, wherein the high-level conductive pattern has a second top end and a second bottom end, the first bottom end is lower than the second bottom end, and the first top end and the second top end are substantially at the same level;
    a conductive pillar, disposed over the substrate, and overlapping and electrically connected to the low-level conductive pattern;
    a landing pad, disposed on the conductive pillar, and overlapping and electrically connected to the conductive pillar, wherein sidewalls of the conductive pillar are recessed from sidewalls of the landing pad, wherein the landing pad and the conductive pillar are respectively made of different conductive materials, and a resistivity of the landing pad is less than a resistivity of the conductive pillar; and a storage capacitor, disposed over and electrically connected to the landing pad.

2. The semiconductor device structure of claim 1, wherein a footprint area of the landing pad is greater than a footprint area of the conductive pillar.

3. The semiconductor device structure of claim 1, further comprising:

a capacitor plug, disposed on and electrically connected to the landing pad, wherein the storage capacitor is disposed on and electrically connected to the capacitor plug.

* * * * *